United States Patent [19]

Kojima

[11] Patent Number: 5,045,656
[45] Date of Patent: Sep. 3, 1991

[54] SWITCH PROVIDED WITH INDICATOR

[75] Inventor: Hisanao Kojima, Amagasaki, Japan

[73] Assignee: Idec Izumi Corporation, Osaka, Japan

[21] Appl. No.: 433,943

[22] Filed: Nov. 9, 1989

[30] Foreign Application Priority Data

| Jul. 5, 1989 | [JP] | Japan | 1-079750[U] |
| Jul. 7, 1989 | [JP] | Japan | 1-080676[U] |
| Oct. 13, 1989 | [JP] | Japan | 1-267633 |

[51] Int. Cl.⁵ .......................................... H01H 21/02
[52] U.S. Cl. ................................. 200/314; 200/332.1
[58] Field of Search ............... 200/314, 315, 312, 337, 200/332.1

[56] References Cited

U.S. PATENT DOCUMENTS 3,796,452  3/1974  Foster et al. ...................... 200/332.1

FOREIGN PATENT DOCUMENTS

| 283052 | 9/1988 | European Pat. Off. | 200/314 |
| 3435609 | 4/1986 | Fed. Rep. of Germany | 200/314 |
| 3706681 | 9/1988 | Fed. Rep. of Germany | 200/315 |
| 2168850 | 6/1986 | United Kingdom | 200/314 |
| 8807754 | 10/1988 | World Int. Prop. O. | 200/315 |

Primary Examiner—Renee S. Luebke
Attorney, Agent, or Firm—Pollock, Vande Sande & Priddy

[57] ABSTRACT

A built-in indicator switch unit include an indicator and a switch within a casing so that the switch is operated by a pushing operation applied to a light-transmissible operation cover provided in the front side of the indicator. The switch is actuated by an operation mechanism which inverts the pushing force exerted on the operation cover to an opposite direction in response to the pushing operation applied to the operation cover. The indicator and switch are attached to a printed circuit board arranged in the casing, substantially in parallel to the front surface of the casing and projecting out at one end from the casing.

12 Claims, 19 Drawing Sheets

SWITCH PROVIDED WITH INDICATOR

BACKGROUND OF THE INVENTION

1. Field of the Invention

The present invention relates to an integral structure of an indicator and a switch (hereinafter referred to as "an indicator built-in switch unit") which has a switching function as well as an indicating function and which is suitable for use in such a manner that, for example, it is attached on an operation panel of an automatic vending machine such as an automatic ticket vending machine.

2. Description of the Prior Art

Two examples of the prior art indicator built-in switch units of the type as described above are illustrated in FIGS. 1 and 2.

In FIG. 1, an indicator built-in switch unit 2 is configured in such a manner that an indicator 12, such as an LED indicator or the like, and a switch 16 are attached on a solid printed circuit board 10 at its front and rear sides respectively (upper and lower sides respectively in the drawing) with a space provided there between for an operation mechanism. The term a "solid printed circuit board" in the specification means a "hard printed circuit board" contrary to a flexible printed circuit board. The solid printed circuit board 10 provided with the indicator 12 and the switch 16 is housed in a casing 8 constituted by a holder 4 and a cover 6 both of which are made of an insulating material, and a portion of the printed circuit board 10 is extended to project outwardly from the housing for use for external connection.

Further, a light-transmissible operation cover 20 is fitted in the front portion of the casing 8. When the operation cover 20 is pushed and released, an actuator 18 of the switch 16 is pushed and released to thereby operate the switch 16 by the action of an operation mechanism constituted by two movable members 22 and 24 and a coiled spring 26 connecting the two movable members 22 and 24 to each other. At that time, an electrical signal externally fed from the switch 16 and another electrical signal externally fed to the indicator 12 correspondingly to the operation of the switch 16 are transmitted through the outwardly extended portion of the printed circuit board 10.

An indicator built-in switch unit 28 in FIG. 2 will be described mainly to point out differences with respect to switch unit 2 in FIG. 1. In FIG. 2, items which are the same or equivalent to those shown in FIG. 1 are referenced correspondingly. In this case, a flexible printed circuit board 30 is used in place of the solid printed circuit board 10. The flexible printed circuit board 30 is bent so as to form two, front and rear, stages within the casing 8. Terminals 14 of the indicator 12 and terminals 17 of the switch 16 are soldered respectively to the front and rear stages of the flexible printed circuit board 30. A part of the flexible printed circuit board 30 is outwardly from the rear of casing 8.

The operation mechanism of the switch 16 is constituted by two left and right coil springs 34 and a movable member 32 supported by the two coil springs 34 at their front sides, so that when the operation mechanism is pushed and released by means of the operation cover 20, the actuator 18 of the switch 16 is operated.

However, both indicator built-in switch units 2 and 28 share a disadvantage since they require large depths $L_1$ and $L_2$ to provide space for the terminals 14 and the operation mechanism between the indicator 12 and the switch 16, and further because the space for the terminals 17 is necessary at the rear side of the switch 16.

Additionally, in the indicator built-in switch unit 2 of FIG. 1 the terminals 14 of the indicator 12 must be arranged in one row and bent at 90 degrees as shown in the drawing in order to use only one solid printed circuit board 10 to thereby make the switch inexpensive. Accordingly, the pitch of the terminals 14 inevitably becomes small in the case where the number of the terminals 14 is large (for example, 12 terminals are required in an indicator for indication of four digits of numerals), and it is necessary to pay fine attention so that the interval between adjacent terminals is not short-circuited in soldering, making the assembling difficult.

On the other hand, in the indicator built-in switch unit 28 in FIG. 2, the printed circuit board 30 which is flexible and bent transversely is used. Accordingly, the terminals 14 of the indicator 12 can be arranged in two row and there arises therefore no problem of such poor workability as described above. The indicator built-in switch unit 28 is more expensive than the unit 2 using the solid printed circuit board 10 because of use of the flexible printed circuit board 30.

An indicator built-in switch unit of the type as described above basically has a structure in which an indicator and a switch are put into a casing so that the inner switch is operated by pressing a light-transmissible operation cove provided in the front side of the indicator. Further, the indicator can indicate the contents of an electric signal given from the outside.

In recent years, attempts have been made to provide ticket vending machines or the like which can be used by both visually handicapped and non-handicapped persons. In one known example, a plurality of indicator built-in switch units 2 are arranged on an operation panel of a ticket vending machine or the like as shown in FIG. 15 (in which the plane of the paper of drawing corresponds to the operation panel) and are provided with braille tapes 4a (inscribed in braille for respectively expressing the contents of indication for the indicator built-in switch units 2) respectively stuck to the vicinities (for example, upper portions) of the indicator built-in switch units 2.

In the aforementioned configuration, each indicator built-in switch unit 2 and the braille tape 4a corresponding to the switch unit 2 are prepared separately. In particular, in the case where a large number of indicator built-in switch units 2 are arranged side by side in several rows, the distance between upper and lower indicator built-in switch units vertically adjacent to each other is shortened. Accordingly, this case a disadvantage in that the correspondence between the braille tape 4a and the indicator built-in switch unit 2 may be missed (in particular, the upper and lower indicator built-in switch units 2 may be mistaken for each other).

Further, spaces for the braille tapes 4a must be provided. Furthermore, the distance between upper and lower indicator built-in switch units vertically adjacent to each other must be enlarged sufficiently to reduce operation errors. Accordingly, a large space is required and, the operation panel or the like becomes large in size.

Further, as shown in FIG. 26, indicator built-in switch units 2 each having a numerical indicator 4b provided in the back of a light-transmissible operation cover 3a to electrically indicate a fare are used in the conventional ticket vending machine or the like. Or, as shown in FIG. 27, illuminated push-button switches each having a name indication plate 8a provided in the back of a light-transmissible operation cover 7a to indicate (inscribe) both fare and destination are used in the conventional ticket vending machine or the like.

In the indicator built-in switch unit 2 as shown in FIG. 26, a destination and a corresponding fare must be checked through an information display plate, or the like, provided separately and then a switch corresponding to the fare must be searched and pushed. Accordingly, there arises a disadvantage in that much labor is taken for selection of the switch.

On the other hand, in the illuminated push-button switch 6a in which both destination and fare are written as shown in FIG. 27, the aforementioned disadvantage can be almost eliminated. However, the name indication plate 8a must be exchanged for new one whenever the fare is changed. Accordingly, requires labor for the exchanging work.

SUMMARY OF THE INVENTION

The present invention is therefore aimed to eliminate the aforementioned disadvantages in the prior art and a first object of the invention is to provide an indicator built-in switch unit in which the depth can be reduced and in which rows of terminals of an indicator can be arranged in one printed circuit board even in the case where the printed circuit board is a solid printed circuit board.

A second object of the present invention is to provide a novel and useful indicator built-in switch unit in which characters written in braille are provided in a portion of the front side of an operation cover so that the operation cover can be easily pressed by fingers used for reading the characters written in braille to prevent a visually handicapped person from missing the correspondence between the characters written in braille and the switch unit, and in which the characters written in braille are provided to avoid the front of the indicator so that the switch unit can be used by both visually handicapped and nonhandicapped persons.

A third object of the present invention is to provide an indicator built-in switch unit which is simple in configuration and has a small number of necessary parts to simplify and facilitate manufacturing, and which has a small depth to facilitate mounting to the operation panel and attain a high space factor.

A fourth object of the present invention is to provide an indicator built-in switch unit which it is easy to select the switch and in which the change of a fare indicated or the like be easily accomplished.

A fifth object of the present invention is to provide an indicator built-in switch unit in which use of any indication plate having fixed contents of indication (destination, trade name, etc.,) and requiring much labor and time for exchange as in a segmental-indicator built-in switch unit provided to attain the fourth object is avoided, and in which the contents of indication can be changed freely and widely through the switching operation of one switch so as to be used for multiple purposes.

To attain the first object, according to one aspect of the present invention, the indicator built-in switch unit comprises: a casing made of an insulator; a printed circuit board arranged in the casing so as to be substantially in parallel to the front surface of the casing and to partly project out from the casing; an indicator attached to the front side of the printed circuit board in the casing; a switch attached to the rear side of the printed circuit board; a light-transmissible operation cover fitted in the front portion of the casing so as to be movable in the direction of pushing force exerted on the operation cover; and an operation mechanism for operating the switch by inverting the pushing force in response to the pushing operation on the operation cover.

In this case, preferably, the operation cover may be configured as to be movable backward and forward or may be rotatable in two opposite directions, towards the front and rear of the switch unit.

Further, preferably, a bent lever-like movable member may be fitted in a bottom portion of the casing so that a fulcrum of the lever-like movable member is taken from the casing, that is to say, the operation mechanism may be configured so that when one end portion of the movable member is pushed by a leg extended from the cover, an actuator projected to the rear side of the switch is pressed by the other end portion of the movable member.

Further, the casing may preferably be composed of a holder and a cover so that a reinforcement plate spring is fitted down in bottom portion of the holder, the movable member being fitted down on the plate spring.

Further, the printed circuit board may be, more preferably, a solid printed circuit board or a flexible printed circuit board. In the case where a part of the printed circuit board extends out of the casing from a side thereof, a rear corner portion of the casing is cut away. In the case where a flexible printed circuit board is used and a part of the printed circuit board extends out of the casing from the rear thereof, whether the rear corner portion of the casing is cut away or not is decided.

In the aforementioned indicator built-in switch unit, the printed circuit board is arranged in the casing to be substantially parallel to the front side of the casing and then the indicator and the switch are attached in the front and rear thereof respectively. Accordingly, the space in the front and rear directions in the casing can be utilized effectively to make it possible to reduce the depth compared with the conventional indicator built-in switch unit.

Furthermore, for the same reason, there is no necessity of bending the printed circuit board by 90° with the terminals of the indicator aligned in one row, even in the case where a solid printed circuit board is used as the printed circuit board. That is, the terminals can be arranged in rows on one printed circuit board.

To attain the second object, according to another aspect of the present invention, in the indicator built-in switch unit characters written in braille are provided in a portion which is in the front of the operation cover and out of the front of the indicator. Preferably, the operation cover is made rotatable in the opposite directions around a shaft provided in the rear portion of the characters written in braille. Preferably, a braille member having the characters inscribed in braille may be removably attached to the operation cover. Also, the operation cover may be removably fitted in the front portion of the casing.

Accordingly, in the indicator built-in switch unit, characters written in braille are provided in a portion of the front side of the operation cover or in other words characters written in braille are united with the operation cover. Accordingly, a visually handicapped person can operate the indicator built-in switch unit through pressing the operation cover by his fingers used for reading the characters written in braille.

Further, the characters written in braille are provided away from the front of the indicator. Accordingly, a visually non-handicapped person can recognize the contents of indication from the indicator with no labor.

To attain the third object, according to a further aspect of the present invention, the indicator built-in switch unit comprises: a casing made of an insulator; a light-transmissible operation cover fitted in a front portion of the casing so as to be movable in the direction of pushing force exerted on the operation cover; a printed circuit board arranged in the casing along a front portion of the operation cover and partly extended out of the casing; an indicator having a plurality of LED chips directly attached in the front side of the printed circuit board in the casing; a switch attached in the rear side of the printed circuit board in the casing; and an operation mechanism for operating the switch by inverting the pushing force in response to the pushing operation on the operation cover. As described above, in this indicator built-in switch unit, the plurality of LED chips forming an indicator are directly attached in the front side of the printed circuit board in the casing. Accordingly, the plurality of pin terminals provided for connection between indicator and the printed circuit board in the prior art become unnecessary, so that the number of connections can be reduced. Further, the printed circuit board peculiar to the indicator becomes unnecessary.

To also attain the third object, according to another aspect of the present invention, the indicator built-in switch unit comprises: a casing made of an insulating material; a light-transmissible operation cover fitted in a front portion of the casing so as to be movable in the direction of pushing force exerted on the operation force; a flexible printed circuit board arranged in the casing along a front portion of the operation cover and partly extended out of the casing; an indicator having a second printed circuit board provided with a plurality of LED chips mounted thereon, the second printed circuit board being directly soldered to the front side of the flexible printed circuit board in the casing; a switch attached in the rear side of the flexible printed circuit board in the casing; and an operation mechanism for operating the switch by inverting the pushing force in response to the pushing operation on the operation cover.

In the indicator built-in switch unit having the aforementioned features, the indication printed circuit board having a plurality of LED chips mounted thereon is directly soldered to the front side of the flexible printed circuit board in the casing. Accordingly, there arises the same advantage in that the plurality of pin terminals provided to connect between the indicator and the printed circuit board in the prior art become unnecessary and, accordingly, the number of connections can be reduced.

To attain the fourth and fifth objects, according to a still further aspect of the present invention, in the indicator built-in switch unit having a structure in which an indicator electrically variable in the contents thereof and a switch are received in a casing so that the switch is operated by pushing operation effected on a light-transmissible operation cover provided in the front side of the indicator, an indication member for indicating the contents of indication is provided in a portion which is in the front of the operation cover and out of the front of the indicator. In this case, preferably the dot-matrix indicator is attached to the rear portion of the operation cover, and a flexible printed circuit board partly extended out of the casing is connected to the dot-matrix indicator so that the dot-matrix indicator can be operated with the operation cover. Preferably, the dot-matrix indicator may be made of an electroluminescent indicator (EL display).

According to the indicator built-in switch unit having the above features, the dot-matrix indicator can indicate an item, such as destination, tradename, etc., and, at the same time, the segmental indicator can indicate another item, such as a corresponding fare, charge or the like. In other words, one item, such as destination, or the like, and the other item, such as a corresponding fare, can be indicated together. Accordingly, the selection of the switch can be easily made. Further, the two indicators are electrically variable in contents of indication thereof. Accordingly, not only the switch can easily cope with the change of the fare but also the switch can easily cope with the changes of the destination, tradename, etc. Furthermore, one switch can be used for multiple purposes through switching the contents of indication in the two indicators.

BRIEF DESCRIPTION OF THE DRAWINGS

Other features and advantages of the present invention will be apparent from the following description taken in connection with the accompanying drawings, wherein.

DESCRIPTION OF THE PREFERRED EMBODIMENTS

Now, referring to the accompanying drawings, the preferred embodiments of the present invention will be described.

Figure 3:
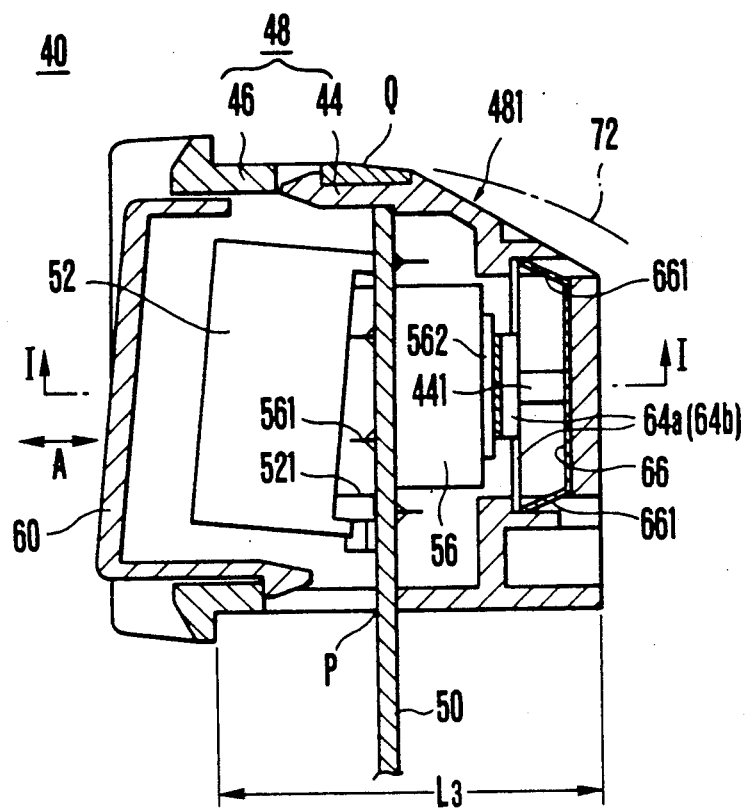
FIG. 3 is a longitudinal section showing an indicator built-in switch unit according to a first embodiment of the, present invention.
Figure 4:
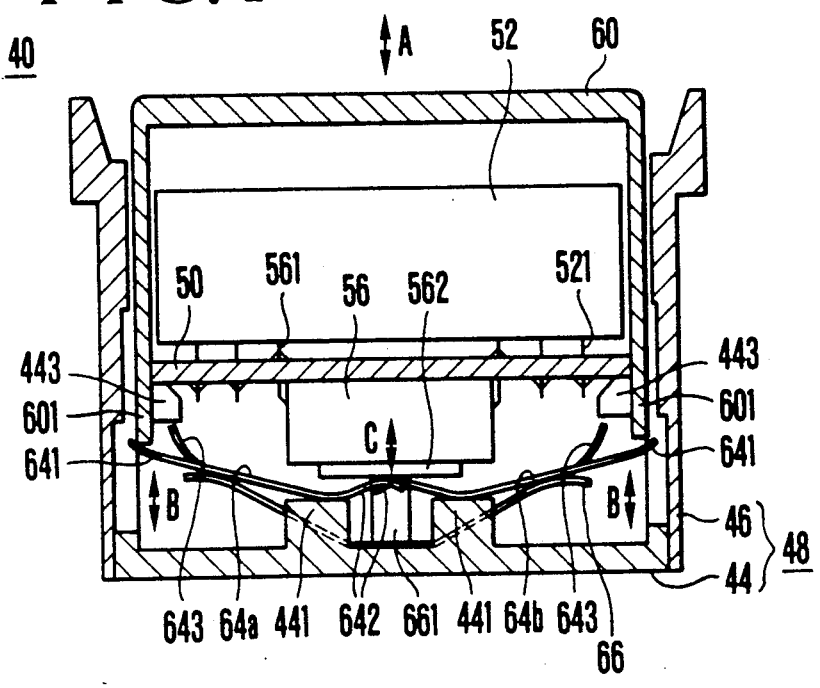
FIG. 4 is a sectional view taken along the line I—I in FIG. 3.
Figure 5:
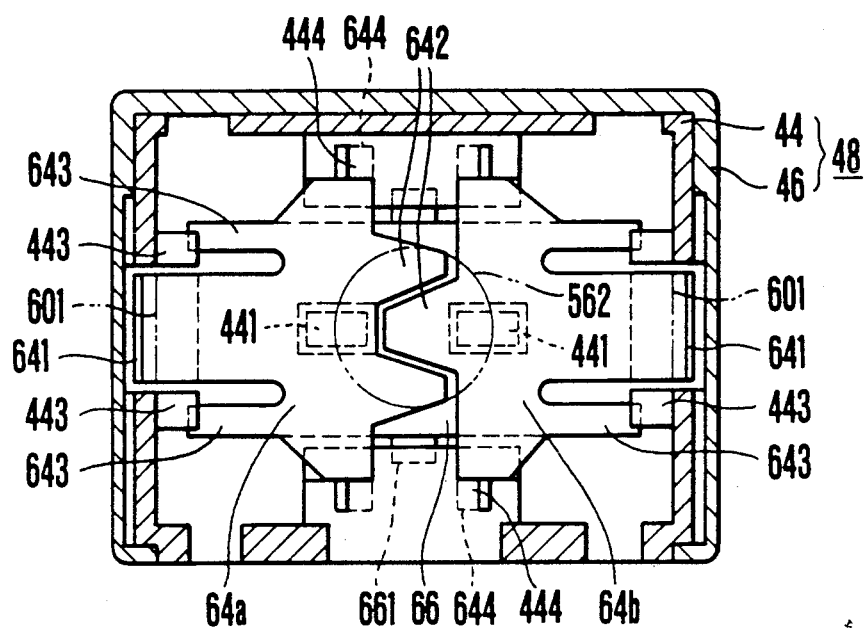
FIG. 5 is a view showing the inside of a bottom portion of a casing of the indicator built-in switch unit depicted in FIG. 3.

FIG. 3 is a longitudinal section showing an embodiment of the indicator built-in switch unit according to the present invention, FIG. 4 is a cross section taken along a line I—I in FIG. 3, and FIG. 5 is a view showing the inside of the bottom portion of the casing of the indicator built-in switch unit of FIG. 3.

In an indicator built-in switch unit 40 of this embodiment, a casing 48 is constituted by a box-like holder 44 opened at its front side (the left side in FIG. 3) and a box-like cover 46 fittingly covering the holder 44 at its opened side. Both the holder 44 and the cover 46 are made of an insulating material. A solid printed circuit board 50 is provided in the casing 48 substantially parallel to the front surface of the casing 48, a part of the solid printed circuit board 50 being outwardly (transversely) extended from one side of the casing 48 for use for external connection.

An indicator 52 such as an LED indicator or the like is attached to the front side (the left side in FIG. 3) of the printed circuit board 50 in the casing 48. A switch 56, such as a tact switch, is attached to the rear side of the printed circuit board 50 in a back-to-back relation with the indicator 52, and an actuator 562 of the switch 56 rearwardly projected from the rear of the switch 56. Respective terminals 521 and 561 of the indicator 52 and the switch 56 are attached, for example, by soldering, to the printed circuit board 50 at its opposite surfaces respectively.

The reason why the indicator 52 and an operation cover 60 which will be described later are upwardly slanted in FIG. 3 is that the upper side in the drawing becomes the upper side in ordinary fashion of use of the indicator built-in switch unit 40 and therefore if the indicator 52 and the operation cover 60 are upward slanted, the indication of the indicator 52 and be easily seen from the slant upward direction. The indicator 52 and the operation cover 60 do not necessarily have to be slanted (for example, see FIG. 7 which will be described later.)

In this embodiment, the light-transmissible operation cover 60 is fitted in the casing 48 at its front portion so as to be slidable in the frontward/rearward direction as shown by an arrow A in the drawing. The operation cover 60 may be transparent or semitransparent, and may be colorless or colored.

Further, in this embodiment, two supporting portions 441 are provided side by side on the bottom surface of the holder 44, and lever-like elastic movable members 64a and 64b, each of which is bent in an inverted-V shape when viewed inside (see FIG. 4) are put on the two supporting portions 441 respectively. Each of the movable members 64a and 64b has a longer portion located at its outer side and a shorter portion located at its inner side. The movable members 64a and 64b may be pushed and released as indicated by arrows B by means of two legs 601 extended from the operation cover 60. At this time, the supporting portions 441 act as fulcrums of the movement of the movable members 64a and 64b respectively, and the respective outer-side end portions 641 of the movable members 64a and 64b act as points for reception of force from the two legs 601 of the operation cover 60. In response to the above-mentioned movement of the movable members 64a and 64b, the respective inner-side end portions 642 of the movable members 64a and 64b act as points of application of force to push and release the actuator 562 of the switch 56 in the directions of an arrow C. Thus, the operation mechanism of the switch 56 is configured. In short, in this operation mechanism, in response to the pushing operation onto the cover 60, the direction of the pushing force exerted on the operation cover 60 is reversed by the movable members 64a and 64b so that the actuator 562 of the switch 56 is operated by the reversed force.

In such a configuration of the operation mechanism of the switch 56, the structure is simple in comparison with the conventional operation mechanism, the parts thereof may be reduced in number and the depth $L_3$, as will be described later, may be also reduced.

The reason for providing a pair of movable members 64a and 64b is that the actuator 562 of the switch 56 can be surely operated even in the case where the operation cover 60 is slantingly pushed. Alternatively, only one of the two movable members 64a and 64b may be provided.

Further, it is preferable to provide a reinforcing plate 66 on the rear surface sides of the movable members 64a and 64b as illustrated in this embodiment so that the restoring force of the movable members 64a and 64b and the operation cover 60 can be increased by the action of the reinforcing-plate spring 66. However, the reinforcing plate spring 66 is not an indispensable member. Further, as shown in the drawings, displacement preventing engagement/stopper portions 661 are extended from the reinforcing plate spring 66 at its opposite sides respectively.

In the indicator built-in switch unit 40, the printed circuit board 50 is disposed in the casing 48 substantially in parallel to the front surface of the casing 48, a part of the printed circuit board 50 is extended outside the casing 48, and the indicator 52 and the switch 56 are attached, back to back with each other, to the printed circuit board 50 at its front and rear surfaces respectively within the casing, so that the front and rear spaces in the casing 48 are effectively used in a manner so that, for example, the length of the terminals 521 and 561 of the indicator 52 and the switch 56 was no influence on the depth dimension. Accordingly, the depth $L_3$ can be reduced extremely in comparison with the conventional indicator built-in switch units 2 and 28 shown in FIGS. 1 and 2 respectively. For example, both the depths $L_1$ and $L_2$ of the conventional indicator built-in switch units 2 and 28 were about 36 mm, while the depth $L_3$ of the indicator built-in switch unit 40 in the embodiment can be reduced to about 19 mm which is about half of that of the conventional indicator built-in switch units. Accordingly, when the indicator built-in switch unit 40 is used, the appliance may be saved in space and may be reduced in size.

Further, since the printed circuit board 50 is disposed in parallel to the front surface of the casing 48, the terminals 521 of the indicator 52 may be arranged in two or more rows on a single solid printed circuit board 50 unlike in the conventional case, for example, of the indicator built-in switch unit 2 in which it has been necessary to align the terminals of the indicator and to bent the terminals at 90 degrees. Accordingly, in the indicator built-in switch unit in this embodiment, soldering work can be easily carried out even in the case where the number of the terminals 521 is large, resulting in of assembling workability. Further, since only one printed circuit board is used, the switch can be manufactured in expensively.

Figure 1:
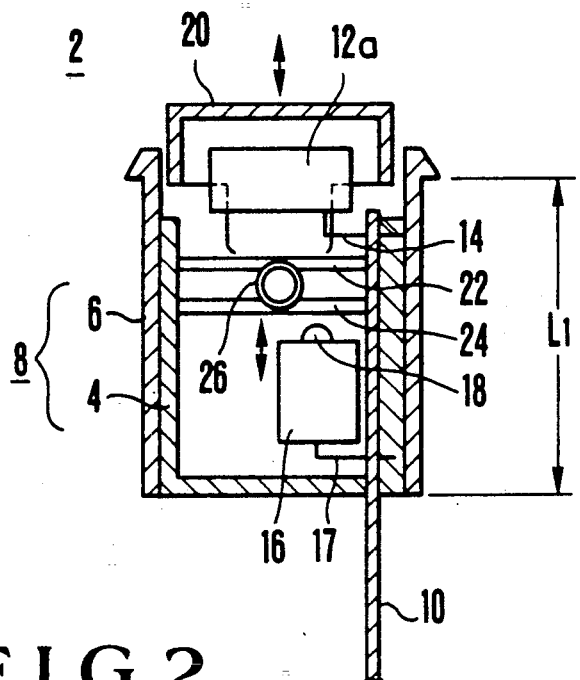
FIGS. 1 and 2 are schematic longitudinal sections showing examples of conventional indicator built-in switch units.
Figure 2:
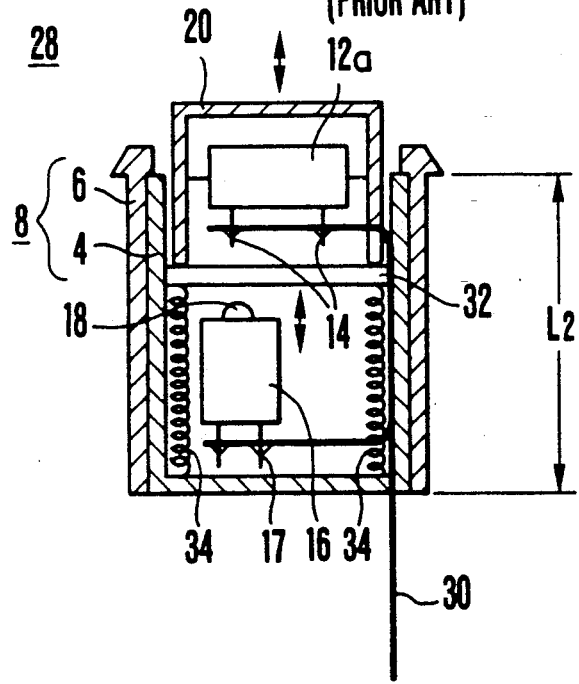

In the conventional case where a part of the printed circuit board 50 is extended from the side surface of the casing 48 as shown in FIG. 1, it has been difficult to attach the indicator built-in switch unit 2 on the operation panel, or the like, in the case where the indicator built-in switch unit 2 is to be attached by inserting it in the operation panel or the like, because the outwardly extended part of the printed circuit board 50 has become a hindrance.

In order to prevent such difficulties, in the indicator built-in switch unit 40 in this embodiment, as shown in FIG. 3, a rear corner portion of the casing 48 (more specifically, the holder 44 in this embodiment) is cut away at the side thereof opposite to the side from which the printed circuit board 50 is extended. In the drawing, the reference numeral 481 designates the cut surface of the casing 48.

The way of cutting will be more specifically described. The cut surface 481 is formed so as to be located at least in the inside of a circular arc 72 which is drawn with a center thereof at a point P on the outer surface of the casing 48 where the printed circuit board 50 is outwardly extended and with a radius which is the distance between the point P and a point Q on the casing 48 at the opposite side to the point P. The cut surface 481 may be a plane as shown in the drawing or may be an R-surface, that is, a curved surface.

Figure 6A:
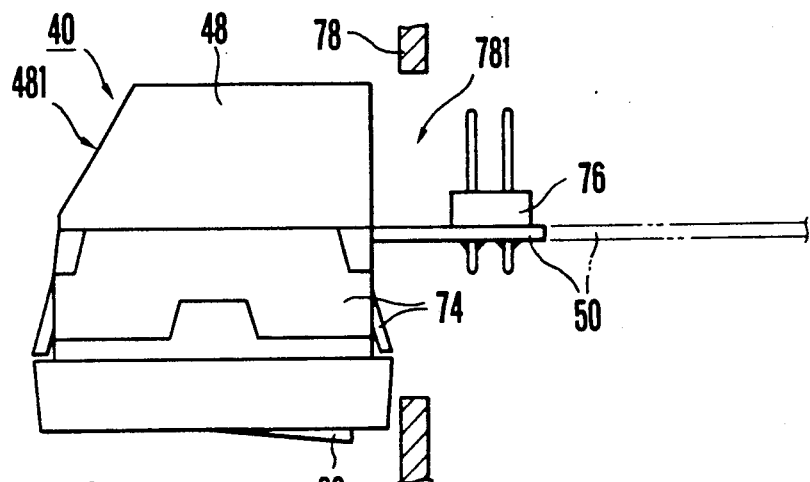
FIGS. 6A, 6B and 6C are views showing a process for installing the indicator built-in switch unit depicted in FIG. 3 in an operation panel.
Figure 6B:
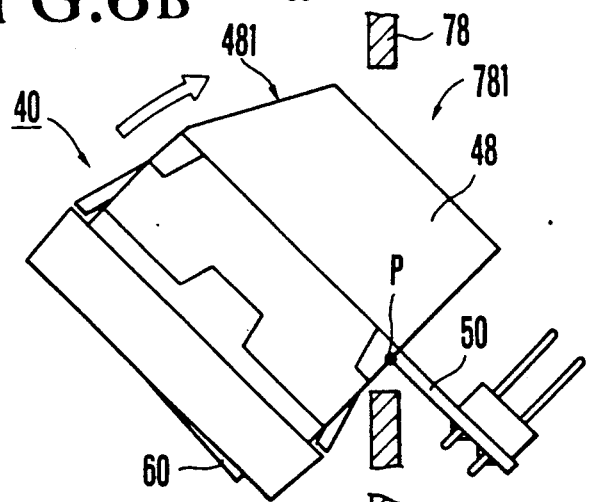
Figure 6C:
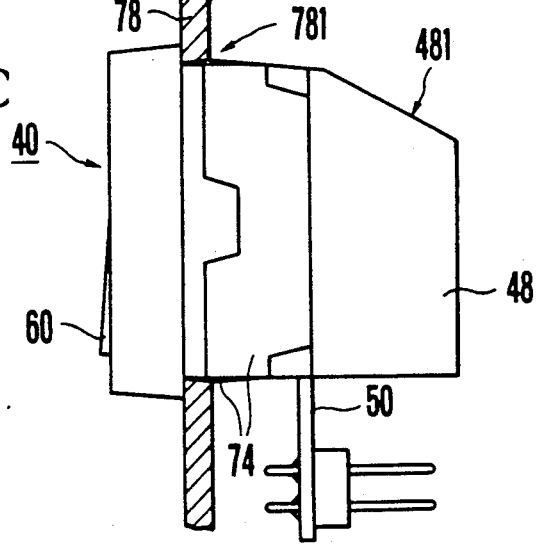

Referring to FIGS. 6A through 6C, now, description will be made as to the procedure of attaching such an indicator built-in switch unit 40 onto the operation panel. First, as shown in FIG. 6A, the outwardly extended portion of the printed circuit board 50 of the indicator built-in switch unit 40 is inserted into an opening portion 781 of an operation panel 78. The opening portion 781 corresponds to the outside form of the indicator built-in switch unit 40. In this case, the printed circuit board 50 may have an externally connecting connector 76 attached thereon in advance, or the printed circuit board 50 may be longer in length than that illustrated. In the drawing, the reference numeral 74 designates a pair of U-shaped panel-attaching plate springs attached on the casing 48 at the outside left and right sides thereof.

Next, as shown in FIG. 6B, the indicator built-in switch unit 40 is turned about a position in the vicinity of the above-mentioned point P. At this time, since the casing 48 has the cut-away rear corner portion as described above, the casing 48 does not touch the operation panel 78.

The indicator built-in switch unit 40 is pushed into the operation panel 78 while being further turned, so that the indicator built-in switch unit 40 is completely fitted in the opening portion 781 of the operation panel 78 and fixed by the plate springs 74, as shown in FIG. 6C.

Referring to FIGS. 3 through 5 again, an example of the procedure of assembling the indicator built-in switch unit 40 will be described hereunder. First, the reinforcing plate spring 66 is fitted from above into the bottom portion of the holder 44, and then the movable members 64a and 64b are fitted from above into the bottom portion of the holder 44 and onto the reinforcing plate spring 66. In this embodiment, side projecting portions 644 and engagement/stopper portions 643 are provided on each of the movable members 64a and 64b, and flotation preventing portions 444 and projections 443 engageable with the projecting portions 644 and engagement/stopper portions 643 respectively are formed on the holder 44 (see FIG. 5, etc.), so that the movable members 64a and 64b can be slidably fitted on the supporting portions 441, and the fitted movable members 64a and 64b can be prevented from coming off (floating up) by the flotation preventing portions 444 and the projectiosn 443 after the movable members 64a and 64b have been fitted. Accordingly, the assembling work is made extremely easy.

Next, the printed circuit board 50 having the indicator 52 and the switch 56 mounted on the front and rear surfaces thereof respectively, is fitted from the above of the movable members 64a and 64b with the part of the printed circuit board 50 extended outside the casing 48. The cover 46 is covered from the front side of the indicator 52, the printed circuit board 50, and the switch 56, and the operation cover 60 is further fitted from the front side of the assembly to thereby complete the assembling.

That is, in the indicator built-in switch unit 40, the parts may be put in order from the bottom, so that not only the operation mechanism but the whole of the indicator built-in switch unit 40 is extremely easily assembled, and it is easy to cope with automatization of the assembly process.

If a solid printed circuit board 50 as described in the above embodiment is used as a printed circuit board, the cost can be lowered in comparison with the case of using a flexible substrate. A flexible printed circuit board may, of course, be used if necessary. If a flexible printed circuit board is used, the flexible printed circuit board may be elongated so as to serve also as wiring, so that a cable or the like for interconnection between the indicator built-in switch unit and other appliances (for example, a mother circuit board, etc.) becomes unnecessary, and the connection with the other appliances becomes easy.

Figure 7:
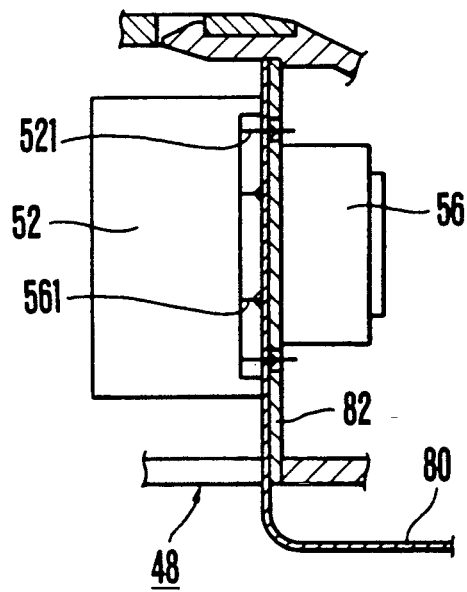
FIG. 7 is a partly sectional view showing a modification of the first embodiment in which a solid printed circuit board in the indicator built-in switch unit according to the first embodiment depicted in FIG. 3 is replaced by a flexible printed circuit board.

FIG. 7 shows an example of modification in which a flexible printed circuit board 80 is used. In this case, if a reinforcing plate 82 is used in the casing 48 together with the flexible printed circuit board 80 as shown in the drawing, the other structure may be quite the same as that in the case of using the solid printed circuit board. Accordingly, one and the same indicator built-in switch unit 40 may easily employ either one of the solid and flexible printed circuit boards in response to user's requirements or the like.

Figure 8:
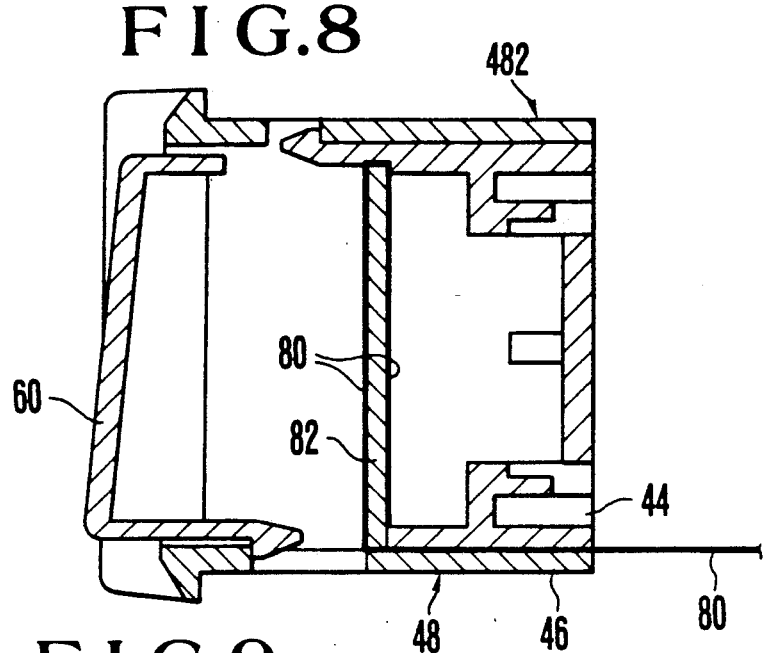
FIG. 8 is a partly sectional view showing another modification of the first embodiment in which a flexible printed circuit board is used in the indicator built-in switch unit depicted in FIG. 3 and is partly extended from the rear surface of the casing.

Further, in the case of using the flexible printed circuit board 80, for example, as shown in FIG. 8, the flexible printed circuit board 80 may be bent along the wall surfaces in the inside of the casing 48 and a part of the bent printed circuit board 80 may be passed through between the holder 44 and the cover 46 so as to project outwardly from the rear surface of the casing 48. In such a configuration, it is not always necessary to cut away the rear corner portion of the casing 48 as in the embodiment illustrated in FIG. 3, and the indicator built-in switch unit of this modification may be easily inserted into the operation panel or the like even if the casing 48 has a rear corner portion 482 which is not cut away. However, the rear corner portion 482 may be cut away like the rear corner portion 481 for the purpose of use of the casing 48 commonly to the case of the embodiment of FIG. 3, for the purpose of unification of design, or the like.

Further, as in this example of modification, if both the opposite surfaces of the reinforcing plate 82 are covered with the flexible printed circuit board 80 in the inside of the casing 48, a printed circuit board having only one conductor surface may be used as the flexible printed circuit board 80 and the terminals 521 and 561 of the indicator 52 and the switch 56 may be soldered on both the front and rear sides of the flexible printed circuit board 80, so that the cost can be lowered in comparison with the case where a printed circuit board having opposite conductor surfaces is used as the flexible printed circuit board 80.

Figure 9:
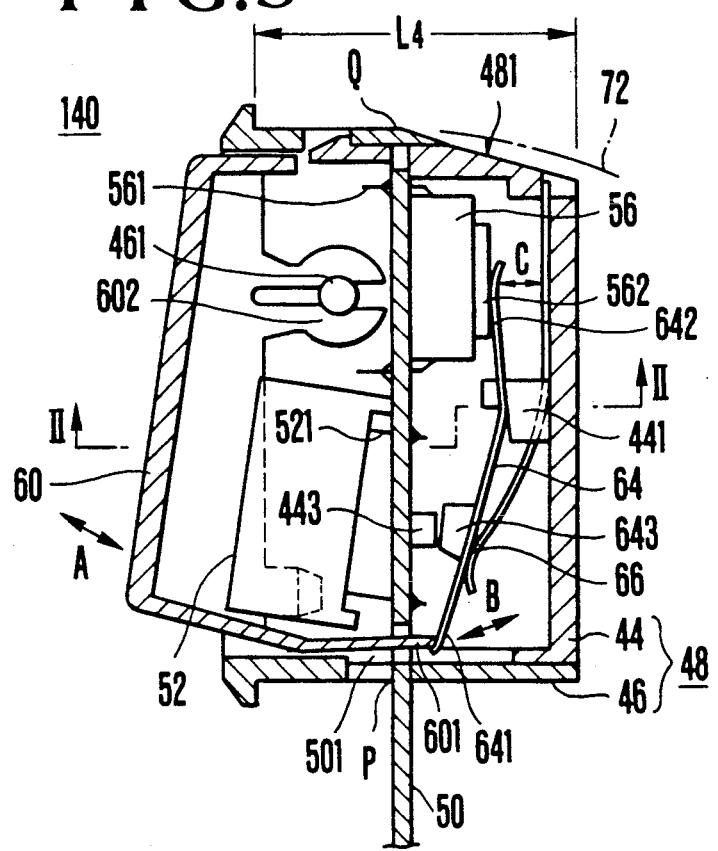
FIG. 9 is a longitudinal section showing an indicator built-in switch unit according to a second embodiment of the present invention.
Figure 10:
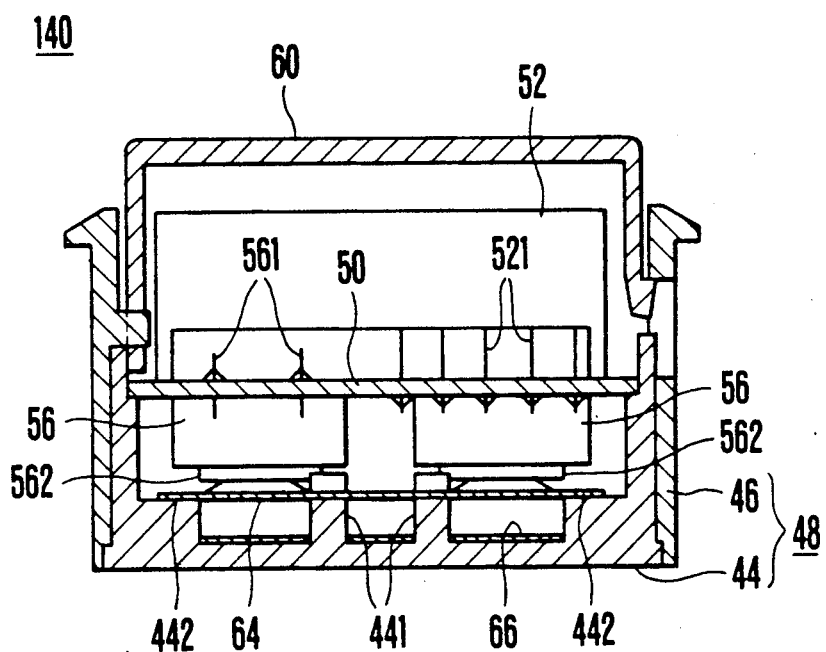
FIG. 10 is a sectional view taken in the like II—II in FIG. 9.
Figure 11:
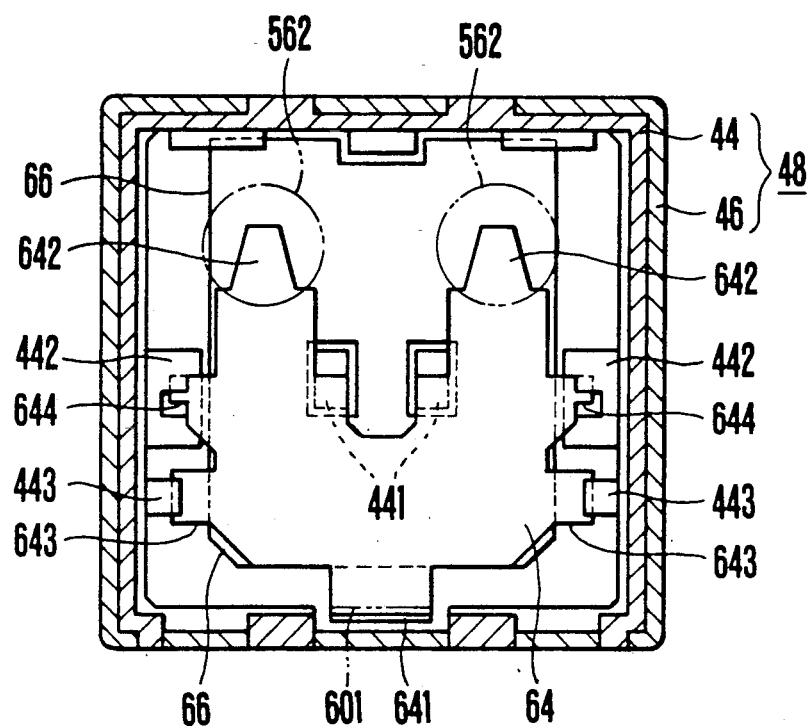
FIG. 11 is a view showing the inside of a bottom portion of a casing of the indicator built-in switch unit depicted in FIG. 9.

FIG. 9 is a sectional view showing a second embodiment of the indicator built-in switch unit according to the present invention. FIG. 10 is a sectional view taken along a line II—II in FIG. 9, in which left half of terminals 521 of an indicator 52 is omitted for better illustration. FIG. 11 is a view showing the inside of the bottom portion of a casing of the indicator built-in switch unit in FIG. 9. In order to simplify description, items the same as or equivalent to those in the first embodiment described above with respect to FIGS. 3 through 8 are referenced correspondingly, and the points different from the first embodiment will be mainly described hereunder.

The basic configuration of an indicator built-in switch unit 140 of the second embodiment is substantially similar to that of the indicator built-in switch unit 40 of the first embodiment except for the operation mode of the operation cover 60. That is, a casing 48 is constituted by a holder 44 and a cover 46, and a solid printed circuit board 50 is provided in the casing 48 substantially in parallel to the front surface of the casing 48 (the left surface in FIG. 9) so that a part of the solid printed circuit board 50 is extended from one side surface of the casing 48 to the outside (transversally) for use for external connection. An indicator 52 is attached to the front surface side of the printed circuit board 50 in the casing 48, two switches 56 are attached to the rear surface side of the printed circuit board 50 (see FIG. 10), and actuators 562 of the respective switches 56 project rearwardly. The reason why it is preferable to slant the indicator 52 and the operation cover 60 is the same as that described above.

In this second embodiment, unlike the first embodiment, the light-transmissible operation cover 60 fitted in the casing 48 at the front portion thereof has two fitting portions 602 rotatably fitted to two projecting shafts 461 inwardly projected from the left and right surface sides of the cover 46 so that the operation cover 60 is rotatable about the projecting shafts 461 in the directions as indicated by an arrow A (see FIG. 9).

Further, in this second embodiment, the operation mechanism of the switches 56 is configured in a manner as follows. Supporting portions 441 and 442 are provided on the bottom surface in the holder 44 at its central portions and opposite sides respectively, and an elastic lever-like movable member 64 is put on the supporting portions 441 and 442. The lever-like movable member 64 is substantially U-shaped in plan view (see FIG. 11) and is bent into an inverted-V shape in side view having a longer half portion and a shorter half portion (see FIG. 9), so that the movable member 64 can be pushed and released in the directions as indicated by an arrow B by means of a leg 601 extended from the operation cover 60. At this time, the supporting portions 441 and 442 act as fulcrums of the movement of the movable member 64, and the longer-portion side end portion 641 of the movable member 64 acts as a point of reception of force from the leg 601 of the operation cover 60. In response to the above-mentioned movement of the movable member 64, the shorter-portion side end portions 642 of the movable member 64 act as points of application of force to push and release two actuators 562 of the respective switches 56 at the same time in the directions of an arrow C. Thus, the operation mechanism of the switches 56 is configured. In short, in this operation mechanism, in response to the pushing applied onto the operation cover 60, the direction of the pushing force exerted on the operation cover 60 is reversed by the movable member 64 so that the actuators 562 of the respective switches 56 are operated by the reversed force.

In pushing operation of the operation cover 60, if a position near the lower end portion thereof is pressed, the movement of the operation cover 60 is light because the center of rotation of the operation cover 60 is at a position near the upper end portion thereof. A notch 501 is formed in the printed circuit board 50 so that the printed circuit board 50 does not interfere with the leg 601 of the operation cover 60.

Having a configuration as described above, the operation mechanism of the switches 56 in this second embodiment becomes simple in structure in comparison with the conventional one, so that the number of parts can be reduced and the depth $L_4$ of the switch assembly, which will be described later, can be made small.

Further, in the indicator built-in switch unit 40 of the first embodiment shown in FIG. 3, and the like in which the operation cover 60 and the indicator 52 are slanted so that the operation cover 60 is pushed from slantwise above, the pressing direction and the moving (sliding) direction of the operation cover 60 do not coincide with each other. Accordingly, there is a possibility that the lower portion of the operation cover 60 and the casing 48 are rubbed with each other which causes wear or the like. On the contrary, in the second embodiment in which the operation cover 60 is rotatable, such a possibility never occurs, so that the indicator built-in switch unit 140 is more preferable in view of a simple operation, prolongation of life time, and the like. The reason why it is preferable to provide a reinforcing plate spring 66 on the rear surface of the movable member 64 is the same as described above. The number of the switches 56 may be reduced to one. In this case, the number of the end portions 642 of the movable member 64 may be reduced to one.

Also in the indicator built-in switch unit 140 of the second embodiment, the printed circuit board 50 is provided within the casing 48, substantially in parallel to the front surface of the casing 48. A part of the printed circuit board 50 is extended outside the casing 48, and the indicator 52 and the switches 56 are attached to the printed circuit board 50 at its front and rear surfaces respectively, so that the front and rear spaces in the casing 48 are effectively used, and, for example, the length of the terminals 521 and 561 of the indicator 52 and the switch 56 has no influence on the depth dimension. Accordingly, when the indicator built-in switch unit 40 is used, the appliance may be saved in space and may be reduced in size.

Figure 12A:
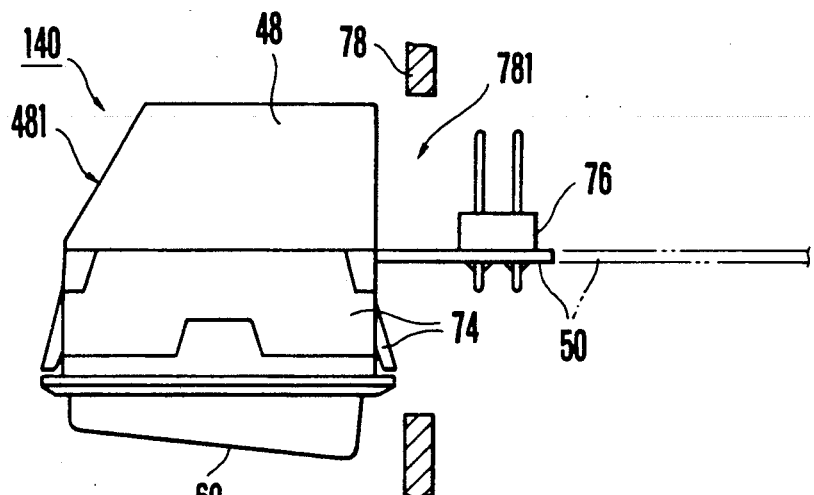
FIGS. 12A, 12B and 12C are views showing a process for installing the indicator built-in switch unit depicted in FIG. 9 in an operation panel.
Figure 12B:
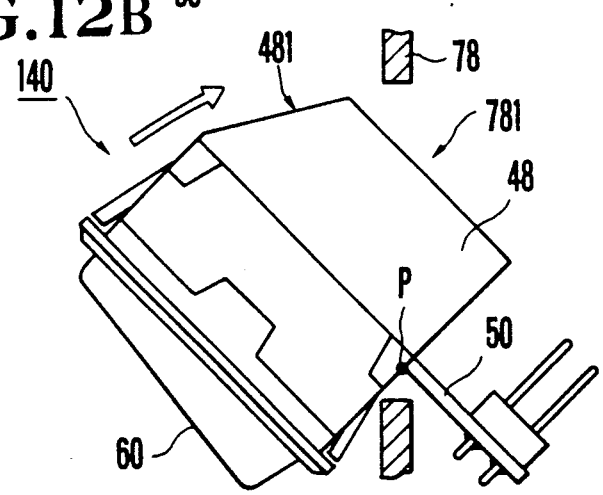
Figure 12C:
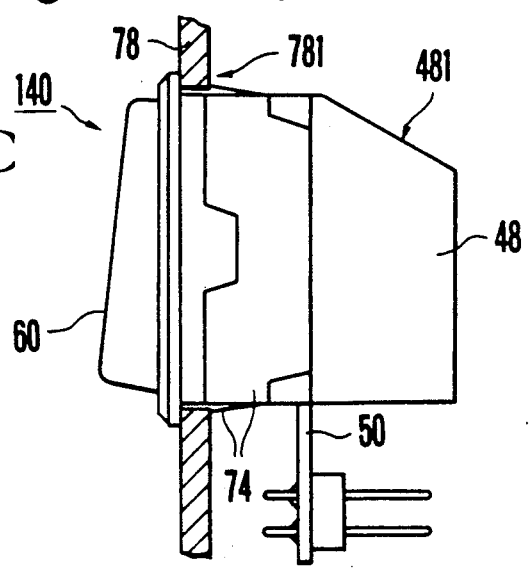

Further, since the printed circuit board 50 is disposed in parallel to the front surface of the casing 48, the terminals 521 of the indicator 52 may be arranged in two or more rows on the single solid printed circuit board 50. Accordingly, in the indicator built-in switch unit in this embodiment, soldering work can be easily carried out even in the case where the number of the terminals 521 is large, resulting in improvement in an assembling operation. Further, since only one printed circuit board is used, the switch can be manufactured inexpensively. The reason why the rear corner portion of the casing 48 is cut away and the method of cutting the cut surface 481 in the case where a part of the printed circuit board 50 is transversally extended from the side surface of the casing 48 as in this embodiment are the same as described above. The procedure of attaching the indicator built-in switch unit 140 onto an operation panel 78 is illustrated in FIGS. 12A through 12C. Since this procedure is substantially the same as that of FIGS. 6A through 6C, the same description will be omitted here.

Referring to FIGS. 9 through 11 again, an example of the procedure of assembling the indicator built-in switch unit 140 of the second embodiment will be described hereunder. First, the reinforcing plate spring 66 is fitted from above into the bottom portion of the holder 44, and then the movable member 64 is fitted from above into the bottom portion of the holder 44 and onto the reinforcing plate spring 66. In this case, in this embodiment, side projecting portions 644 and engagement/stopper portions 643 are provided on the movable member 64, and flotation preventing slots and projections 443 engageable with the projecting portions 644 and engagement/stopper portions 643 respectively are formed in the supporting portions 442 and on the holder 44 respectively (see FIG. 11, etc.), so that the movable member 64 can be slidably fitted on the supporting portions 441 and 442, and can be prevented from coming off (floating up) by the flotation preventing portions 444 and the projections 443 after the movable member 64 has been fitted. Accordingly, the assembling work is made extremely easy. Next, the printed circuit board 50 having the indicator 52 and the switch 56 mounted on the front and rear surfaces thereof respectively is fitted from the above of the movable members 64a and 64b with the part of the printed circuit board 50 extended outside. The cover 46 is covered from the front side of the indicator 52, the printed circuit board 50, and the switch 56, and the operation cover 60 is further fitted from the front side of the assembly to thereby complete the assembling.

That is, in the indicator built-in switch unit 40, the parts may be put in order from the bottom, so that not only the operation mechanism but the whole of the indicator built-in switch unit 40 is extremely easily assembled, and it is easy to cope with automatization of the process of assembly.

Figure 13:
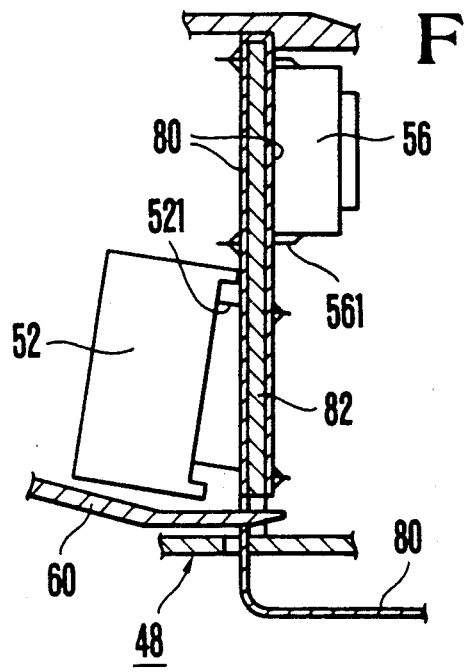
FIG. 13 is a partly sectional view showing a modification of the second embodiment in which a solid printed circuit board in the indicator built-in switch unit according to the first embodiment depicted in FIG. 9 is replaced by a flexible printed circuit board.

Also in this second embodiment, the flexible printed circuit board 80 may be used in place of the solid printed circuit board 50. The example of modification in which the flexible printed circuit board 80 is used is illustrated in FIG. 13. Also in the modification, the reinforcing plate 82 is used together with the flexible printed circuit board 80, and the opposite surfaces of the reinforcing plate 82 are covered with the flexible printed circuit board 80. The reason why this configuration is preferable is the same as described above.

Figure 14:
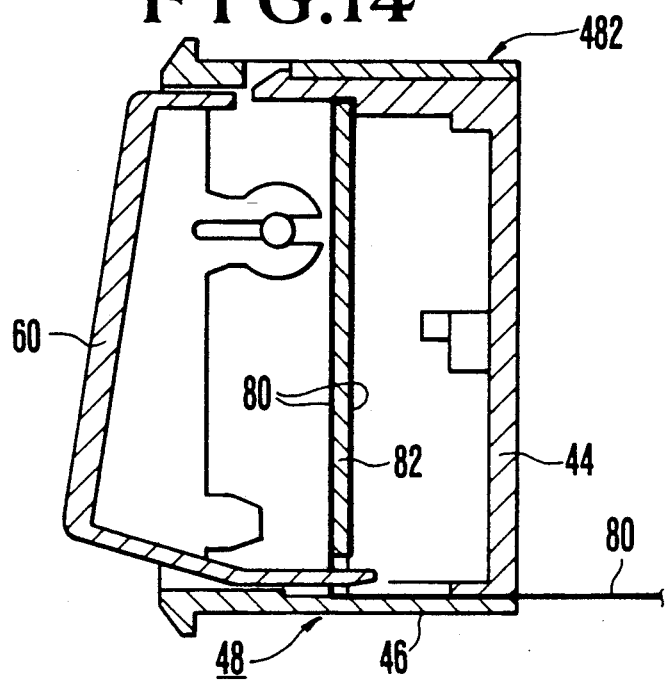
FIG. 14 is a partly sectional view showing another modification of the first embodiment in which a flexible printed circuit board is used in the indicator built-in switch unit depicted in FIG. 9 and is partly extended out of the rear surface of the casing.
Figure 15:
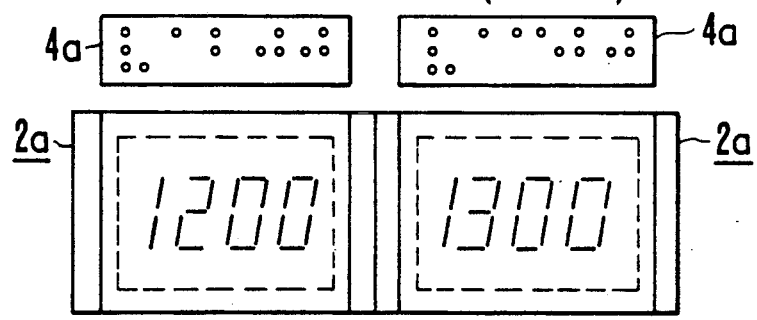
FIG. 15 is a front view showing a conventional technique having a structure in which a plurality of conventional indicator built-in switch units are arranged side by side on an operation panel, and braille tapes inscribed in braille corresponding to the switch units are stuck to the operation panel.
Figure 15:
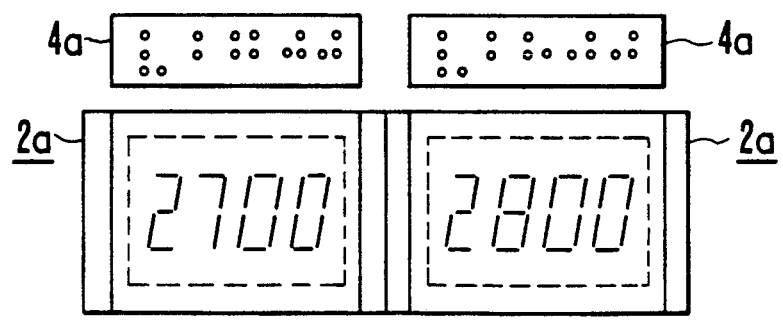

Further, in the case of using the flexible printed circuit board 80, for example, as shown in FIG. 14, the flexible printed circuit board 80 may be bent along the wall surfaces in the inside of the casing 48 and a part of the bent printed circuit board 80 may be passed through between the holder 44 and the cover 46 so as to project outward from the rear surface of the casing 48. In such a configuration, it is not always necessary to cut away the rear corner portion of the casing 48 as in the second embodiment illustrated in FIG. 9, and the indicator built-in switch unit of this modification may be easily inserted into the operation panel or the like even if the casing 48 has a rear corner portion 482 which is not cut away.

Figure 16:
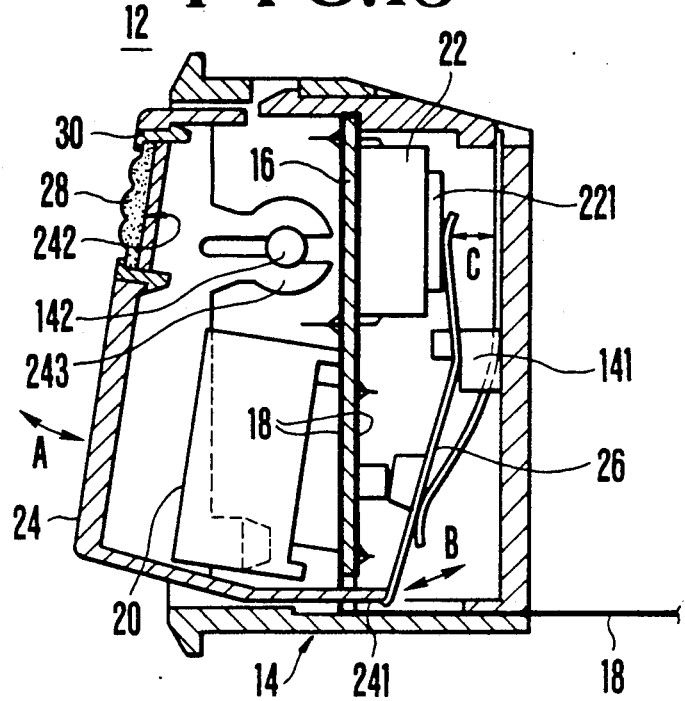
FIG. 16 is a longitudinal section showing an indicator built-in switch unit according to a third embodiment of the present invention.
Figure 17:
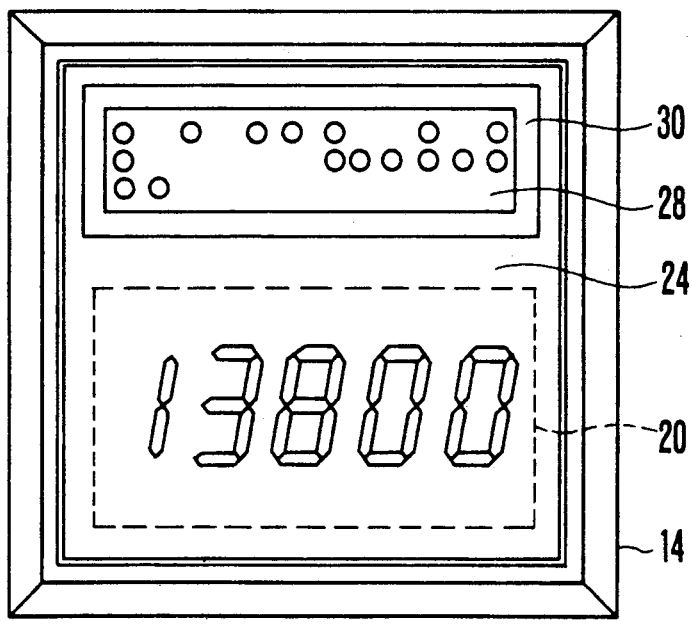
FIG. 17 is a front view of the indicator built-in switch unit depicted in FIG. 16.

FIG. 16 is a longitudinal section showing a third embodiment of the indicator built-in switch unit according to the present invention. FIG. 17 is a front view showing the indicator built-in switch unit of FIG. 16.

An indicator built-in switch unit 12 of the third embodiment is configured in such a manner that a reinforcing plate 16 is disposed in a casing 14 made of an insulator substantially parallel to the front surface (the left surface is FIG. 16) of the casing 14. The opposite, front and rear, surfaces of the reinforcing plate 16 are covered with a flexible printed circuit board 18 having only one conductor surface and having a part thereof extended out from the rear surface of the casing 14 for use for external connection. This configuration may be modified so that a solid printed circuit board is used in place of the reinforcing plater 16 and the flexible printed circuit board 18 as described above and a part of the solid printed circuit board is drawn out from a side surface of the casing 14.

An indicator 20 such as an LED indicator or the like is attached to the front side (the left side in FIG. 16) of the printed circuit board 18 in the casing 14. A switch 22, such as a tact switch, is attached to the rear side of the printed circuit board 18 and an actuator 221 of the switch 22 is rearwardly extended from the rear side of the switch 22.

The reason why the indicator 20 and an operation cover 24 which will be described later are upwardly slanted in FIG. 16 is that the upper side in the drawing becomes the upper side in ordinary fashion of use of the indicator built-in switch unit 12 and therefore if the indicator 20 and the operation cover 24 are upward slanted, the indication of the indicator 20 can be easily seen from the slant upwardly direction. The indicator 20 and the operation cover 24 do not have to be slanted to realize the present invention.

The light-transmissible operation cover 24 removably fitted in the casing 48 at the front portion thereof has two fitting portions 243 rotatably and removably fitted to two projecting shafts 142 inwardly projected from the left and right surface sides of the casing 14 so that the operation cover 24 is rotatable about the projecting shafts 461 in the front and rear directions as indicated by an arrow A. The operation cover 60 may be transparent or semitransparent, and may be colorless or colored.

Supporting portions 141 are provided on the bottom surface of the casing 14, and an elastic lever-like movable member 26 is received in the casing 14 and put on the supporting portions 141. The lever-like movable member 26 is substantially U-shaped in plan view and is bent into an inverted-V shape inside view having a longer half portion and a shorter half portion, so that the movable member 26 can be pushed and released in the directions as indicated by an arrow B by means of a leg 241 extended from the operation cover 24 in response to the pushing of the operation cover 24 in the direction of an arrow A. At this time, the supporting portions 141 act as fulcrums of the movement of the movable member 26, and the longer-portion side end portion of the movable member 26 acts as a point of reception of force from the leg 601 of the operation cover 24. In response to the movement of the movable member 26, the shorter-portion side end portion of the movable member 26 acts as a point of application of force to push and release the actuator 221 of the switch 22 in the directions of an arrow C.

A recess portion 242 is formed in the front surface of the operation cover 24 at a part thereof which is not in front of the indicator 20 and which is, in this embodiment, in front of the projection shafts 142 acting as pivotal axes of the foregoing rotation of the operation cover 24. A tape-like or plate-like braille mark member 28 on which braille marks have been stamped is received in the recess portion 242, and covered with a removable frame-like braille mark cover 30. Thus, the braille mark stamped member 28 is removably attached to the operation cover 24. The contents of braille marks of the braille mark stamped member 28 are made to correspond to those of indication indicated by the indicator 20 in actual use of the indicator built-in switch unit 12.

Thus, in the indicator built-in switch unit 12 described above, the braille marks and the operation cover 24 are united with each other. Accordingly, when the indicator built-in switch unit 12 is used, for example, in a ticket vending machine or another vending machine as described above, a visually handicapped person can operate the indicator built in switch unit 12 by pushing the operation cover 24 with his or her fingers by which the person has just detected the contents of the braille marks. Accordingly, there is no possibility of occurrence of maloperation due to erroneous operation by a visually handicapped person as a result of misunderstanding on the correspondence between the braille marks and the switch unit. Further, since the braille mark stamped member 28 is provided so as not to obstruct the forward sight of the indicator 20 as described above, also a visually healthy person can visually recognize the contents of indication of the indicator 20 with no trouble. Therefore, the indicator built-in switch unit 12 and hence a ticket vending machine or the like using the indicator built-in switch unit 12 can be used for visually handicapped persons and visually healthy persons. Moreover, unlike the conventional indicator built-in switch unit, it is not necessary to provide the braille mark stamped tape or the like separately from the operation cover 24, so that the space for the braille mark stamped tape is not necessary. Further, even if a plurality of indicator built-in switch units 12 is disposed closely to each other, no maloperation occurs for the foregoing reasons, so that the interval between the switches, particularly, vertical intervals, can be reduced. As a result, the space in an operation panel or the like can be reduced and the size of an appliance as a ticket vending machine or the like can be reduced.

Being rotatable about the supporting shafts behind the braille mark stamped member 28 in the direction as illustrated in this third embodiment, the operation cover 24 is not easily rotated even if pressing force is slightly applied to the operation cover 24 when fingers touch the braille mark stamped member 28 to recognize the contents of braille marks. Further, it suffices to push a portion slightly under the braille mark stamped member 28 when a person wishes to push the the operation cover 24, and therefore the probability of occurrence of maloperation during recognition of the contents of braille marks is reduced. The operation cover 24 may be configured so as to be movable or slidable in the opposite direction towards the front and rear of the switch unit. In such a case, if the pressing force (that is, the spring force of the movable member 26 or the like) or the stroke of the operating cover 24 is taken into consideration, it is possible to reduce the probability of occurrence of maloperation during recognition of braille mark contents.

Figure 18:
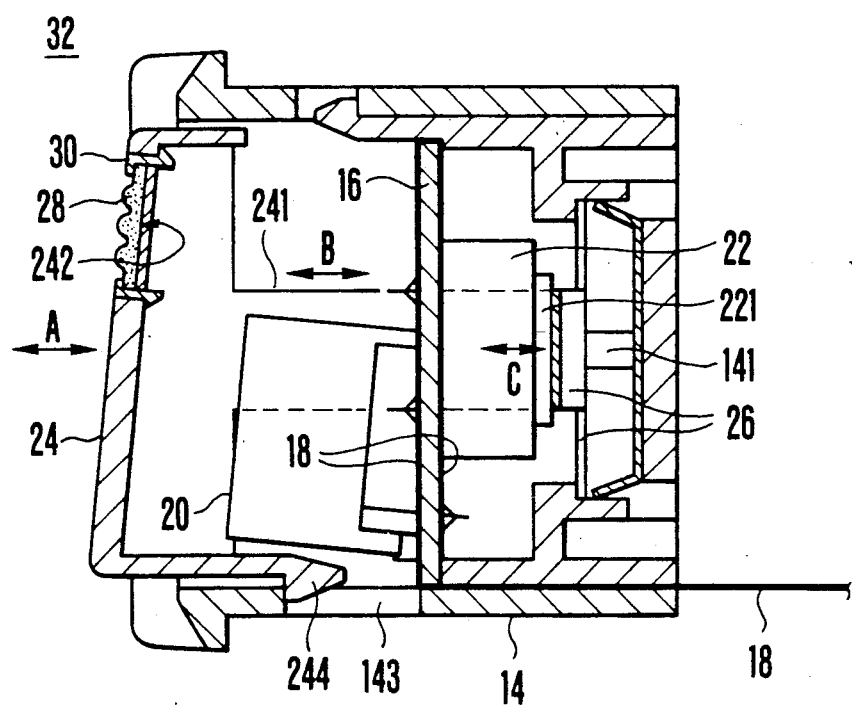
FIG. 18 is a longitudinal section showing an indicator built-in switch unit according to a fourth embodiment of the present invention.

FIG. 18 shows a fourth embodiment of the indicator built-in switch unit according to the present invention. In an indicator built-in switch unit 32 of this embodiment, an operation cover 24 is configured to be movable or slidable in the directions. Specifically, in this fourth embodiment, the operation cover 24 has fitting projections 244 formed thereon and the casing 14 has recess portions 143. The operation cover 24 is removably fitted in the front surface portion of the casing 14 through fitting of the fitting projections 244 into the recess portions 143 so that the operation cover 24 is movable or slidable in the direction towards the front and rear of the unit 32 as indicated by an arrow A in FIG. 18. Further, the operation cover 24 has a leg 241 so that the leg 241 may push a lever-like movable member 26 extending in the direction perpendicular to the paper of drawing to thereby operate an actuator 221 of a switch 22 in the direction as indicated by an arrow C in FIG. 18. The configuration of the other parts of the fourth embodiment is substantially the same as that of the third embodiment of FIG. 16, and therefore the detailed description is omitted.

If a braille mark stamped member 28 is removably attached on the operation cover 24 in a manner as described above in the foregoing embodiments, and the contents of indication is to be changed, for example, when a fare or the like is to be changed, the indicator built-in switch unit 32 may easily cope with the change only by replacing the braille mark stamped member 28 by a new one. Altenatively, the braille mark stamped member 28 may be bonded on the operation cover 24 or braille marks may be directly stamped on the operation cover 24 itself. Even in the latter case, since the operation cover 24 is removably fitted in the front surface portion of the casing 14 as described above, in the indicator built-in switch unit 32 the change of fare or the like may easily be made only by replacing the operation cover 24 by new one.

Further, in the case where the braille-mark stamped member 28 is received in the recess portion 242 formed in the operation cover 24 and the braille mark stamped member 28 is covered with the braille mark cover 30 as illustrated in the third and fourth embodiments, the indicator built-in switch unit maintaining good appearance and good operation function because no excessive projections are formed on the surface of the operation cover 24 regardless of the fact that the braille mark stamped member 28 is simply received in the recess portion 242 or the braille mark stamped member 28 is bonded on the surface of the operation cover 24. Further, this indicator built-in switch unit is preferable since it is important that the braille mark stamped member 28 is not removed or peeled. Such a configuration is however not always necessary to realize the present invention.

Figure 19:
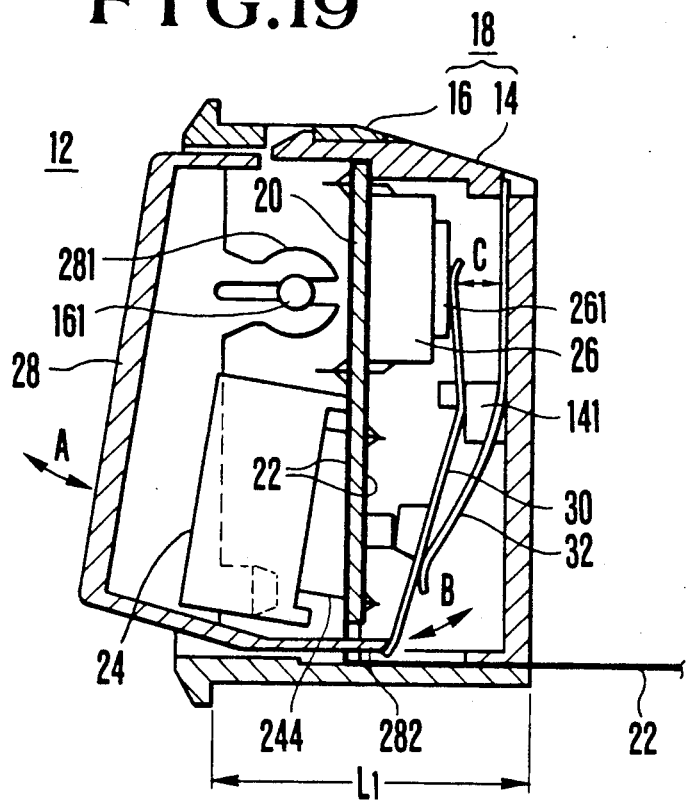
FIG. 19 is a longitudinal section showing an example of a prior example indicator built-in switch unit forming the background of the present invention.
Figure 20:
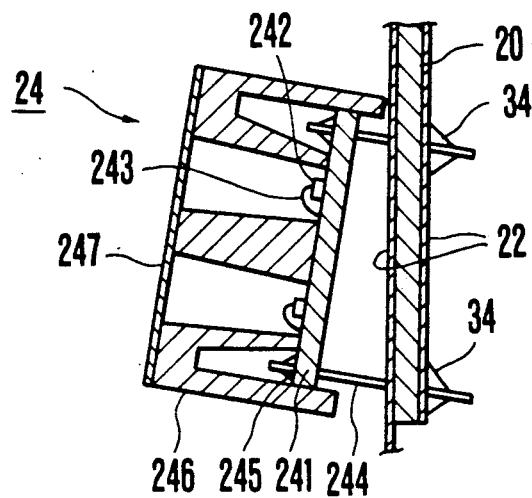
FIG. 20 is an enlarged sectional view of an indicator portion depicted in FIG. 19.
Figure 21:
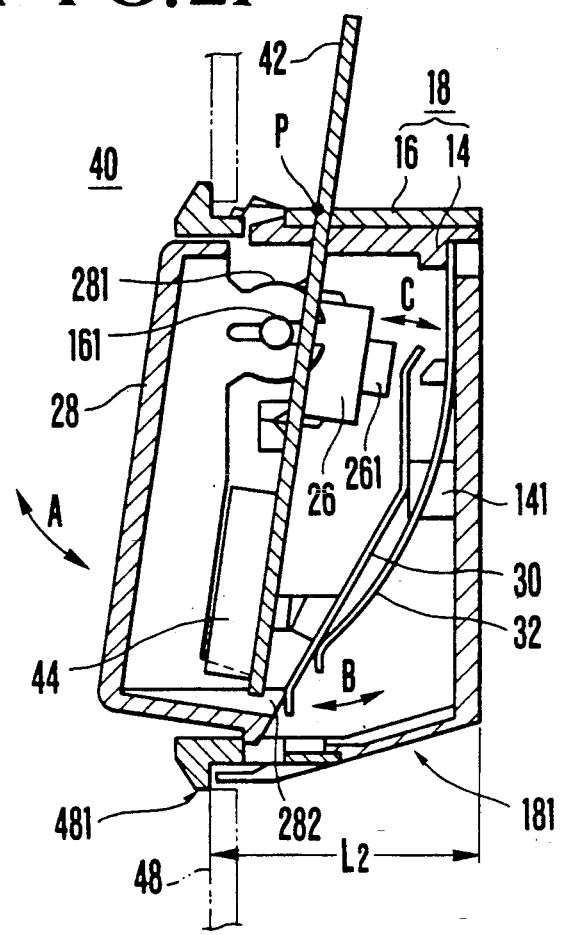
FIG. 21 is a longitudinal section showing an indicator built-in switch unit according to a fifth embodiment of the present invention.

FIG. 21 is a longitudinal section showing a fifth embodiment of the indicator built-in switch unit according to the present invention. This embodiment is an improvement of the indicator built-in switch unit 12 of FIG. 19 which is shown as a prior example corresponding to the foregoing second embodiment illustrated in FIG. 9.

In the indicator built-in switch unit 40 of the fifth embodiment, a solid printed circuit board (the term "solid" means "hard" in this specification, in comparison with the concept of "soft" or "flexible") 42 is disposed in a casing 18 along the slanting front surface of an operation cover 28. A part of the solid printed circuit board 42 is extended out, transversely, from a side surface of the casing 18 for use for external connection. An indicator 44 is provided on the front surface of the printed circuit board 42 in the casing 18, and two switches 26 are provided side by side on the rear surface of the printed circuit board 42 (the positional relationship of two actuators 261 of the respective switches 26 is shown in FIG. 23).

Figure 22:
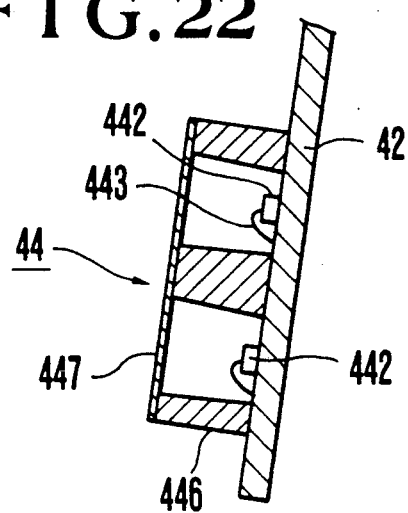
FIG. 22 is an enlarged sectional view of an indicator portion depicted in FIG. 21.

Referring to FIG. 22, the configuration of the indicator 44 will be described. In the fifth embodiment, a plurality of LED chips constituting the indicator 44 are directly mounted on the front surface of the printed circuit board 42 within the casing 18. Specifically, a plurality of LED chips 442 are disposed in the form of segments on conductors of a predetermined pattern (not shown) provided on the front surface of the printed circuit board 42 to indicate, for example, numerals, and the LED chips 442 are bonded on the conductor, for example, by a conductive adhesive. Further, the LED chips 442 are connected, through wire bonding by use of wires 443, to predetermined conductors provided on the front surface of the printed circuit board 42. Moreover, a lamp house 446 having a diffusion filter 447 mounted thereon is attached on the front surface of the printed circuit board 42 so as to cover the LED chips 442. When the LED chips 442 are to be connected through wire bonding to the conductors on the front surface of the printed circuit board 42, it is preferable the at least the conductor surface portions to be bonded are previously subjected to treatment such as plating with gold, silver, or the like, so that the bonding is easily performed. In the thus configured indicator built-in switch unit 40, since the plurality of LED chips 442 constituting the indicator 44 are directly mounted on the front surface of the printed circuit board 42 within the casing 18, it is not necessary to provide the plurality of pin terminals 244 which are used in indicator built-in switch unit 12 so as to connect the indicator 24 to the printed circuit board 22, and therefore connection portions are reduced. Further, it is not necessary to provide the printed circuit board 241 peculiar to the indicator. As a result, when the indicator built-in switch unit 40 is considered as a whole, not only the number of parts decreases but the number of working steps such as a soldering step and the like decreases in comparison with the case of indicator built-in switch unit 12, so that the manufacturing cost can be reduced. Further, the reliability of the switch 40 is improved because of reduction in number of the connection portions. Further, unlike the prior example case illustrated in FIG. 19, no excessive space is formed between the indicator 44 and the printed circuit board 42 so that the depth dimension $L_2$ of the indicator built-in switch unit 40 can be reduced correspondingly. Although the depth dimension $L_1$ was about 19 mm in indicator built-in switch unit 12, the depth dimension $L_2$ of the indicator built-in switch unit 40 could be reduced to about 16 mm.

Figure 23:
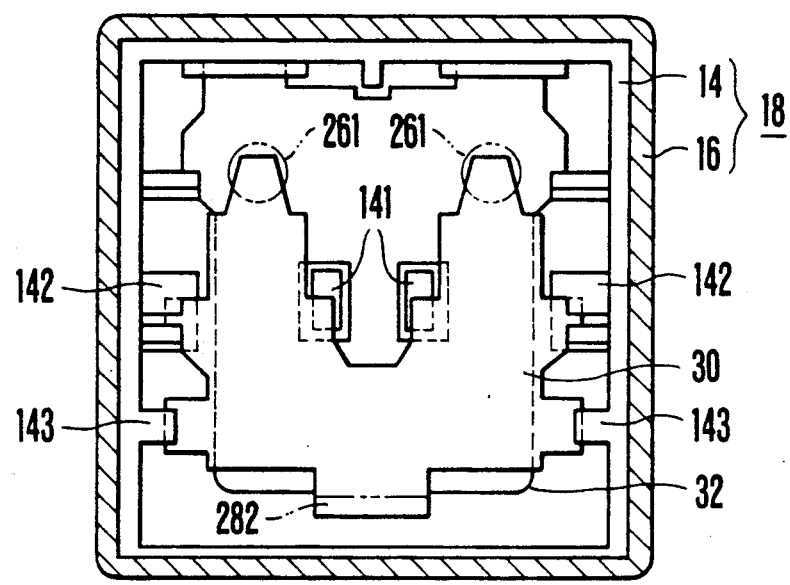
FIG. 23 shows the inside of a bottom portion of the casing in the switch unit shown in FIG. 21.

FIG. 23 shows the inside of a bottom portion of the casing 18 of the indicator built-in switch unit 40. In this embodiment, a movable member 30 U-shaped in side view is fitted on a reinforcing plate spring 32 so as to collectively operate the two switches 26 at the same time. Engagement portions 142 for preventing the movable member 30 from floating up and engagement portions 143 for preventing the movable member 30 from jumping out are provided on a holder 14.

Referring to FIG. 21 again, a rear corner portion of the side surface of the casing 18 opposite to the portion from which the printed circuit board 42 is extended out is cut away to form a cut-away surface 181. The reason why the rear corner portion of the side surface of the casing 18 is cut away is as follows. In this configuration, when the indicator built-in switch unit 40 is to be attached onto an operation panel 48, the portion of the printed circuit board 42 extended out from the casing 18 is first inserted into an opening of the operation panel 48 and then the indicator built-in switch unit 40 is pushed into the operation panel 48 while being rotated counterclockwise in FIG. 21) about a point in the vicinity of a point P at an outlet of the printed circuit board 42. At this time, the indicator built-in switch unit 40 can be inserted into the opening 481 of the operation panel 48 with no interference by the printed circuit board 42 and with no striking by the rear corner portion of the casing 18 against the operation panel 48.

In the case of using the solid printed circuit board 42 of this fifth embodiment as a printed circuit board, the indicator built-in switch unit 40 can be made inexpensive in comparison with the case of using a flexible printed circuit board. However, a flexible printed circuit board can be used if necessary, in combination with a reinforcing plate in the same manner as in the foregoing cases.

In the case of using a flexible printed circuit board, the flexible printed circuit board is made long and used also as wiring to another appliance making it possible to eliminate an interconnection cable or the like. Further, since the flexible pringted circuit board can be bent within the casing 18 so that a part of the flexible printed circuit board is extended out from the rear surface of the casing 18, the indicator built-in switch unit 40 can be inserted into the operation panel 48 of the like even if the rear corner portion of the casing 18 is not cut away unlike the fifth embodiment as illustrated in FIG. 21.

Figure 24:
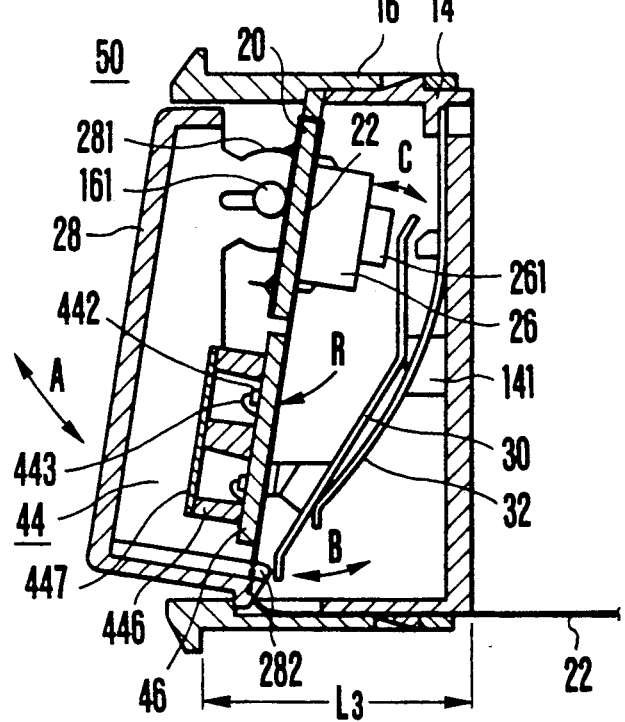
FIG. 24 is a longitudinal section showing an indicator built-in switch unit according to a sixth embodiment of the present invention.

FIG. 24 shows a sixth embodiment of the indicator built-in switch unit which is a modification of the above fifth embodiment, in which in an indicator built-in switch unit 50, a flexible printed circuit board 22 is used in place of the solid printed circuit board 42, and a reinforcing plate 20 for the flexible printed circuit board 22 is provided only on the portion of the switches 26.

Similarly to the above case of the fifth embodiment, the indicator 44 is constituted by a plurality of LED chips 442 which are mounted on a solid printed circuit board 46, and a lamp house 464 or the like is attached on the solid printed circuit board 46. Also in this sixth embodiment, when the LED chips 442 are to be connected through wire bonding to the conductors on the front surface of the solid printed circuit board 46, it is preferable the at least the conductor surface portions to be bonded are previously subjected to treatment such as plating with gold, silver, or the like, to facilitate the bonding. The solid printed circuit board 46 is disposed on a front surface portion of the flexible printed circuit board 22 and both printed circuit boards are directly soldered to each other (through no such pin terminals 244 as used in the prior example).

Figure 25:
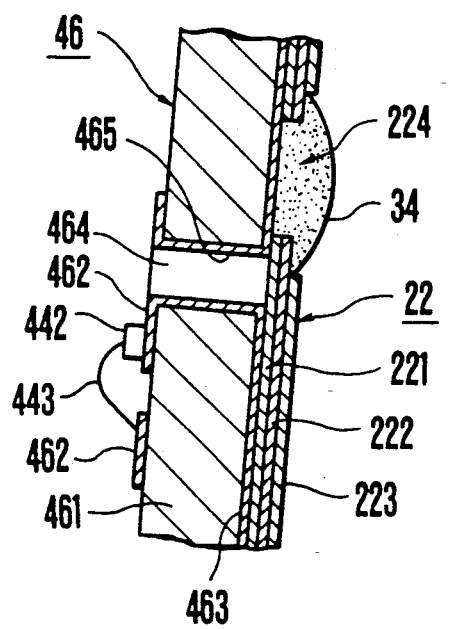
FIG. 25 is an enlarged sectional view of an R-portion depicted in FIG. 24.

A specific example of the soldered portion will be described in detail with reference to FIG. 25 which is an enlarged sectional view showing the portion R in FIG. 24.

The solid printed circuit board 46 has a substrate 461 having conductors 462 and 463 of predetermined patterns provided on the front and rear surfaces thereof respectively, and both conductors 462 and 463 are connected to each other throuth conductors 465 in through holes 464. The plurality of LED chips 442 are attached on the conductors 462 on the front surface of the solid printed circuit board 46 by a conductive adhesive the like, and connected through wire bonding to the conductors 462 by using wires 443, in the same manner as described above. In this sixth embodiment, the flexible printed circuit board 22 is configured such that conductors 222 of a predetermined pattern are provided on the surface of a base film 221 and covered with a cover film 223. Through holes 224 are formed through necessary portions for connection and the conductors 222 are exposed in the surrounding of the through holes 224 so that the conductors 222 and the conductors 463 provided on the rear surface of the solid printed circuit board 46 are directly soldered to each other through solder 34.

In the indicator built-in switch unit 50 of the sixth embodiment of FIG. 24, the solid printed circuit board 46 constituting the indicator 44 serves also as a reinforcing plate for the flexible printed circuit board 22. Further, even in the case of using the flexible printed circuit board 22, it is not necessary that the LED chips 442 are wire-bonded directly onto the flexible printed circuit board 22, and therefore it is not necessary that the flexible printed circuit board 22 is plated with gold, silver, or the like. That is, since it suffices to plate the conductors 462 on the front surface of the solid printed circuit board 46 with gold, silver, or the like, a flexible printed circuit board generally treated by soldering can be used as the flexible printed circuit board 22.

Since the solid printed circuit board 46 constituting the indicator 44 is soldered directly onto the flexible printed circuit board 22 also in the sixth embodiment, it is not necessary to provide such a plurality of pin terminals 244 as used in the prior indicator built-in switch unit 12 so as to connect the indicator 24 to the printed circuit board 22. Further, even if the solid printed circuit board 46 and the flexible printed circuit board 22 are soldered to each other, portions to be soldered are reduced to half (that is, only at the one side) in comparison with the case of using the pin terminals 224, and therefore also connection portions are reduced. As a result, when the indicator built-in switch unit 50 is considered as a whole, the cost thereof can be reduced because the number of parts and the number of working steps such as a soldering step or the like are decreased in comparison with the prior example indicator built-in switch unit 12, and the reliability of the switch 50 is improved because of reduction in number of connection portions.

Further, since no excessive space is formed between the indicator 44 and the flexible printed circuit board 22, the depth dimension $L_3$ of the indicator built-in switch unit 50 can be reduced, for example, to about 16 mm, similarly to the case of the fifth embodiment.

The operation cover 28, movable or slidable in the the direction towards the front and rear directions may be used in place of the rotatable operation cover within the front surface portion of the casing 18 as shown in the foregoing embodiments. Moreover, although it is preferable to make the front surface portion of the operation cover 28 inclined upwardly as shown in the foregoing embodiments and to make the printed circuit boards 42 and 22 and the like in the casing 18 inclined corresponding to the inclination of operation cover 28 as shown in the foregoing embodiments to facilitate operation of the operation cover 28 from the slant upward and facilitate inspection of the contents of indication of the indicator 44, this configuration is not always indispensable to the present invention. That is, the operation cover 28 and the printed circuit boards 42 and 22 may not be inclined.

Figure 26:
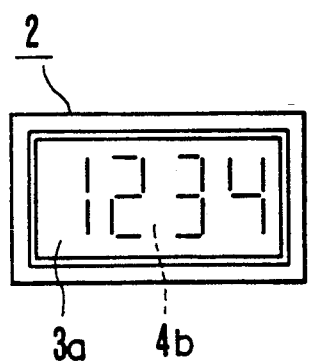
FIG. 26 is a schematic front view showing a conventional technique of an indicator built-in switch unit.
Figure 27:
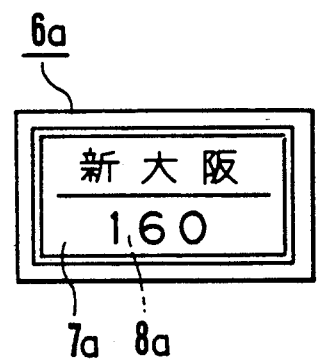
FIG. 27 is a schematic front view showing a conventional technique of an illuminated push-button switch.
Figure 28:
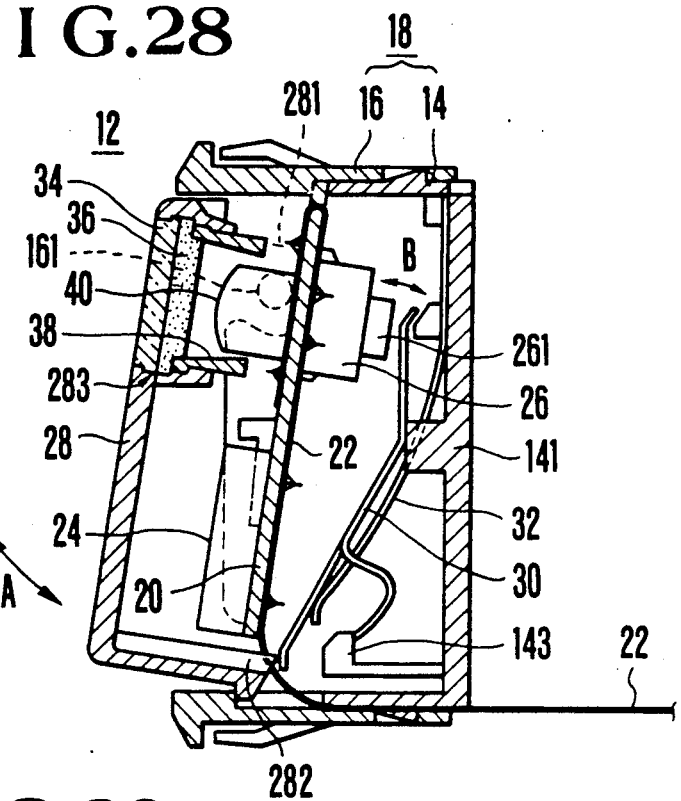
FIG. 28 is a vertical sectional view showing an indicator built-in switch unit according to a seventh embodiment of the present invention.
Figure 29:
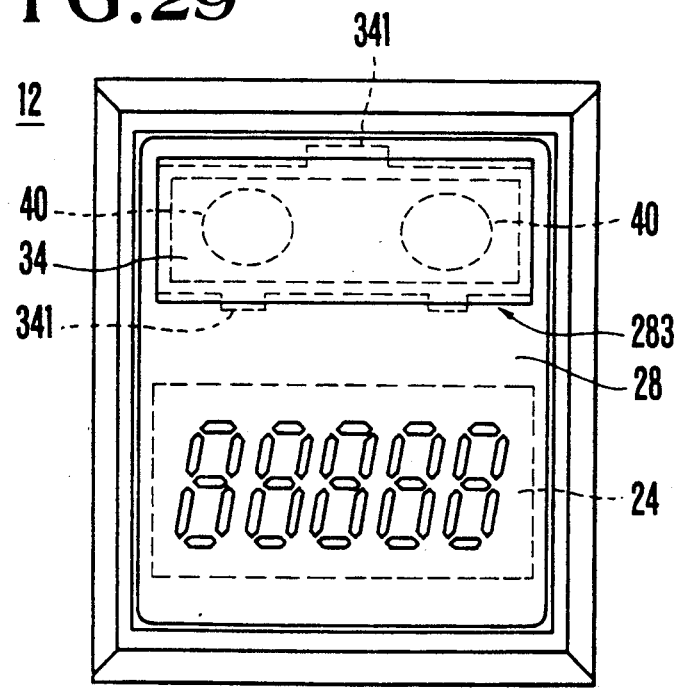
FIG. 29 is a front view of the indicator built-in switch unit depicted in FIG. 28.
Figure 30:
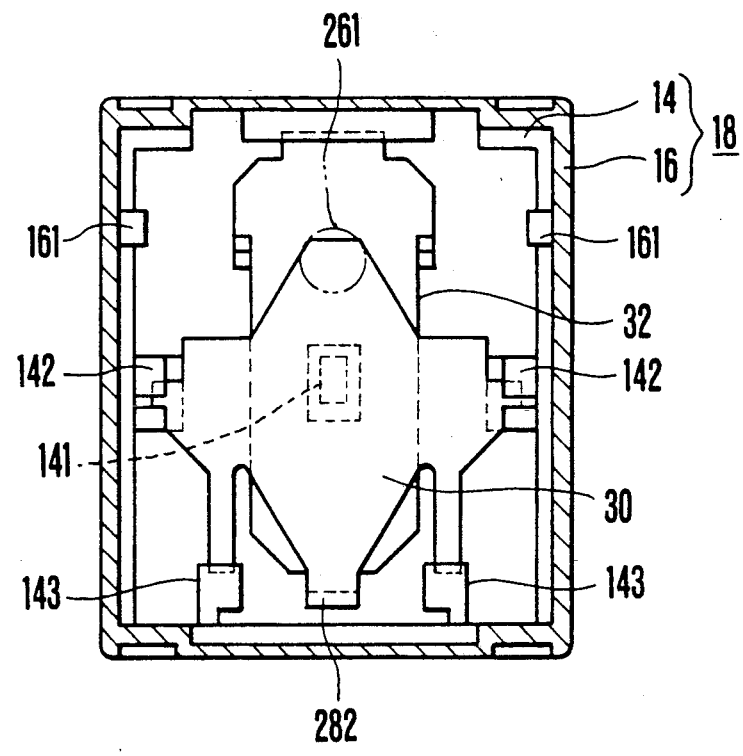
FIG. 30 is a view showing the inside of a bottom portion of the casing in the indicator built-in switch unit depicted in FIG. 28.

FIG. 28 is a longitudinal section showing a seventh embodiment of the indicator built-in switch unit according to the present invention. FIG. 29 is a front view showing the indicator built-in switch unit of FIG. 28. FIG. 30 is a view showing the inside of a bottom portion of a casing of the indicator built-in switch unit of FIG. 28. This embodiment is intended to eliminate the disadvantages of the prior art shown in FIGS. 26 and 27.

In an indicator built-in switch unit 12 of the seventh embodiment, a casing 18 is constituted by an interval structure of a box-like holder 14 made of an insulator and opened at its front side (the left side in FIG. 28), and a box-like cover 16 fittingly covering the holder 14 at its opened side.

In the casing 18, a reinforcing plate 20 with a flexible printed circuit board 22 having one conductor surface is provided on a part of the front surface of the reinforcing plate 20. The rear surface of the reinforcing plate 20 is disposed along a slanting front surface portion of an operation cover 28 which will be described later. The flexible printed circuit board 28 is bent along a wall surface of the casing 18, and a part of the flexible printed circuit board 22 is extended out from the rear surface of the casing 18 through the holder 14 and the cover 16 for use for external connection.

An indicator 24, such as, for example, an LED numerical indicator, or the like, in which the indication contents are electrically variable, is attached on the front surface of the reinforcing plate 20, and the terminals of the indicator 24 are soldered to the flexible printed circuit board 22.

A switch 26 such as a tact switch or the like is attached on the rear surface of the reinforcing plate 20, and an actuator 261 of the switch 26 is provided on the rear surface of the switch 26, the terminals of the switch 26 being soldered to the flexible printed circuit board 22.

On the front surface portion of the casing 18, two fitting members 281 are provided which are rotatably and removably fitted onto two projection shafts 161 projected inwardly from the respective right and left side surfaces of the cover 16 constituting the casing 18, and a light-transmissible operation cover 28 is removably fitted so as to be rotatable about the projection shafts 181 in the front and rear directions as indicated by an arrow A in FIG. 28. The operation cover may be transparent or semitransparent, and may be colored.

The reason why the front surface portion of the operation cover 28 and the indicator 24 are upwardly slanted in FIG. 28 is that the upper side in the drawing becomes the upper side in ordinary fashion of use of the indicator built-in switch unit 12 and therefore if the indicator 24 and the operation cover 24 are upwardly slanted, the operation cover 28 can be operated from the slant upward direction and the contents of indication of the indicator 24 can be easily seen from the slant upward direction. The indicator 24 and the operation cover 28 are not always indispensable to the present invention.

An elastic lever-like movable member 30 is received in a bottom portion of the casing 18, more specifically, of the holder 14 constituting the casing 18. The movable member 30 is bent into an inverted V-shape in side view having a longer half portion and a shorter half portion, so that the movable member 30 can be pushed and released in the directions as indicated by an arrow A by means of a projection 282 provided on the operation cover 28. At this time, the supporting portion 141 provided on the bottom surface of the holder 14 acts as a fulcrum of the movement of the movable member 30, and the longer-portion side end portion of the movable member 30 acts as a point of reception of force from the projection 282 of the operation cover 30. In response to the movement of the movable member 30, the shorter-portion side end portion of the movable member 30 acts as a point of application of force to push and release the actuator 261 of the switch 26 in the directions indicated by an arrow B. Thus, the operation mechanism of the switch 26 is configured. The holder 14 is provided with engagement portions 142 for preventing the movable member 30 from floating up and engagement portions 143 for preventing the movable member 30 from jumping-out.

In the seventh embodiment, a reinforcing plate spring 32 is provided at the rear surface side of the movable member 30 to thereby increase the restoring force of the movable member 30 and the operation cover 28. However, the provision of such a reinforcing plate spring is not indispensable to the present invention. In this embodiment, an opening 283 is provided in the front surface portion of the operation cover 28 so as not to obstruct the forward sight of the indicator 24, a light shielding frame 38 is fitted into the opening 283 to its deepest portion, an indication member 36 is removably fitted in the opening 283 in front of the light shielding frame 38, and an indication portion cover 34 is removably fitted in the opening 283 in front of the indication member 36. At this time, the level of the surface of the indication portion cover 34 is substantially the same as that of the surface of the operation cover 28 so that no excessive projections are formed on the surface of the operation cover 28.

Further, in this embodiment, two light sources 40 such as light emission diodes or the like are provided on a portion of the reinforcing plate 20 behind the indication member 36 and the like, and the terminals of the light sources 40 are soldered to the flexible printed circuit board 22. In this embodiment, the indication portion cover 34 is constituted by a transparent member, and provided with engagement portions 341 for preventing the cover 34 from coming off. The indication member 36 is constituted by a transparent member, and indication contents, for example, destinations, trade names, or the like, are indicated on the front or rear surface of the indication member 36, for example, by carving, printing, or the like. Further, in this embodiment, the indication member 36 is constituted by a semitransparent member so as to also act to diffuse the light from the light sources 40. The light shielding frame 38 encloses a portion from the light sources 40 to the rear surface of the indication member 36 so as to act basically to prevent light from the light sources 40 from leaking sideward.

In the thus configured indicator built-in switch unit 12, therefore, destinations, trade names, or the like are indicated by the indication member 36 attached on the operation cover 28, and fares or the like corresponding to the contents of the indication of the indication member 36 are indicated by the indicator 24 provided in the inside of the switch unit 12, so that destinations, trade names, or the like can be indicated together with fares or the like. Unlike the conventional indicator built-in switch unit 2 in which only numerical indication is performed by the numerical indicator 4, selection of switches can be performed easily.

Since the contents of indication of the indicator 24 are electrically variable, in the case of revising a fare, the contents of indication of the indicator 24 can be electrically changed, for example, by changing a control program for the indicator 24 without labor. Unlike the conventional illuminated push button switch 6 using the system in which the indication plate 8 is changed, the revision of a fare or the like can be easily made in the indicator built-in switch unit 12.

If the indication member 36 is attached on the operation cover 28, it is possible to obtain the foregoing fundamental effects. If the indication member 36 is removably fitted into the opening 283 of the operation cover 28 as illustrated in the seventh embodiment, the indicator built-in switch unit 12 maintains fine appearance and operating function because no excessive projections are formed on the surface of the operation cover 28, and the exchange of the indication member 36 can be easily performed.

Further, if the indication member 36 is constituted by a light-transmissible member and the light sources 40 are provided behind the indication member 36, the contents of indication of the indication member 36 are so bright as to be easily seen.

When the light sources 40 are provided as described above, a diffusion plate for diffusing light from the light sources 40 may be provided on the rear surface portion of the indication member 36 or the indication member 36 may be made to have a function of diffusing light from the light sources 40 as described above in this embodiment. In either configuration, more uniform irradiation light can be obtained. In the case where the indication member 36 is made to have a function of diffusion, there is a further effect that the number of parts is reduced.

If the light shielding frame 38 is provided as shown in the seventh embodiment, light from the light sources 40 can be prevented from leaking to the surrounding of the indicator 24 even when the indicator is disposed closely to the light sources 40 in one and the same casing 18, so that it can be easy to see indication contents of the indicator 24. If the light shielding frame 38 is constituted, for example, by a white member or the like and have the function of reflecting light from the light sources 40 is and the inner circumferential surface of the light shielding frame 38 is spread forward, the light from the light sources 40 can be more efficiently led forward, and therefore indication contents of the indication member 36 can be more easily seen.

The indication member 36 may be made merely as a diffusion plate, and the indication portion cover 34 may be made to be an indication member by indicating the contents of indication, for example, on the rear surface of the indication portion cover 34, or another thin sheet-like light-transmissible indication member may be sandwiched between the indication portion cover 34 and the diffusion plate. Further, a solid printed circuit board (hard printed circuit board) may be used in place of the reinforcing plate 20 and connected to the flexible printed circuit board 22, a part of which is extended out from the casing 18. Alternatively, a solid printed circuit board is used in place of the reinforcing plate 20 and the flexible printed circuit board 22 and a part of the solid printed circuit board is extended out from the casing 18. As the operation cover, an operation cover movable or slidable in the front and rear directions may be used in place of a rotatable operation cover 28 as described above.

If the flexible printed circuit board 22 and the like are disposed in the casing 18 along the front surface portion of the operation cover 28 as shown in the seventh embodiment or along the front surface portion of the casing 18 and the indicator 24, and if the light sources 40 and the switch unit 12 are attached on the front and rear surfaces of the flexible printed circuit board 22 or the like, it is possible to obtain such effect that the depth dimension of the indicator built-in switch unit 12 is not affected by the length of the terminal portions of the indicator 24, the light source 40, and the switch 26, so that the space of the casing 18 in the front and rear directions can be effectively utilized to thereby reduce the depth dimension of the indicator built-in switch unit 12.

Moreover, if the operation mechanism of the switch 26 is constituted by the movable member 30 as described above or the like, the structure of the indicator built-in switch unit 12 can be simplified and the depth dimension of the switch 12 can be reduced.

Figure 31:
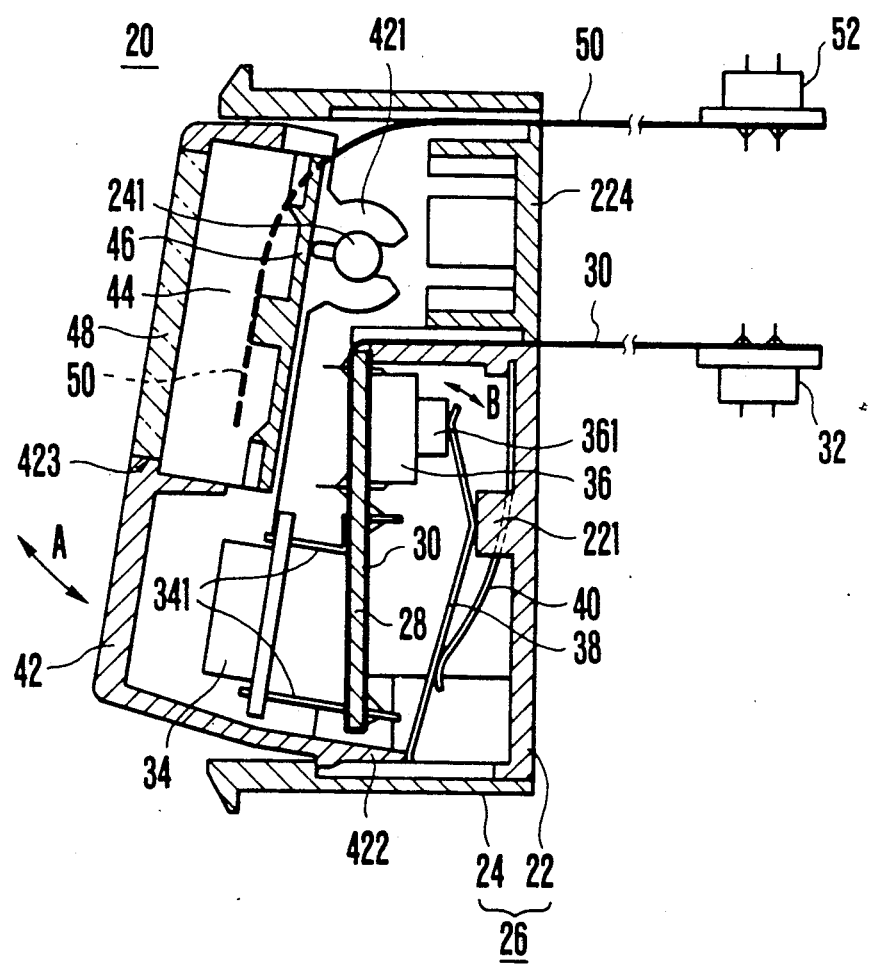
FIG. 31 is a longitudinal section showing an indicator built-in switch unit according to an eighth embodiment of the present invention.
Figure 32:
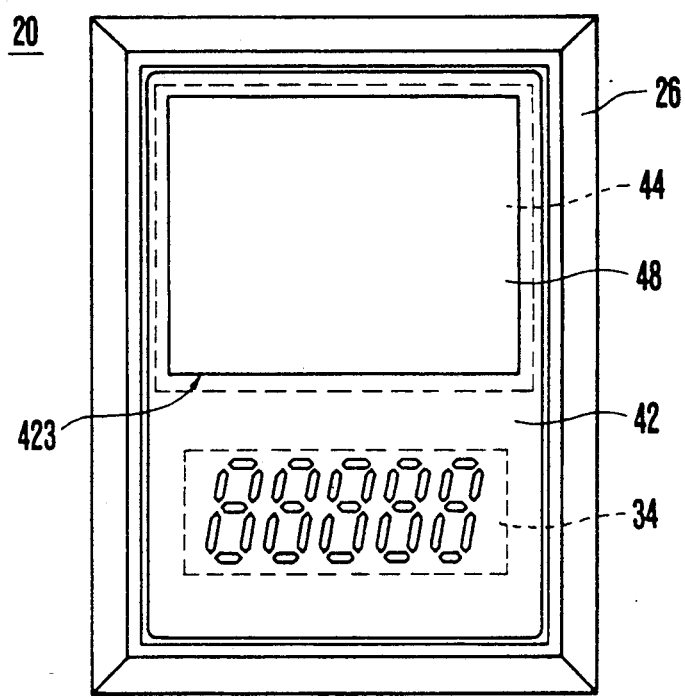
FIG. 32 is a front view of the indicator built-in switch unit depicted in FIG. 31.
Figure 33:
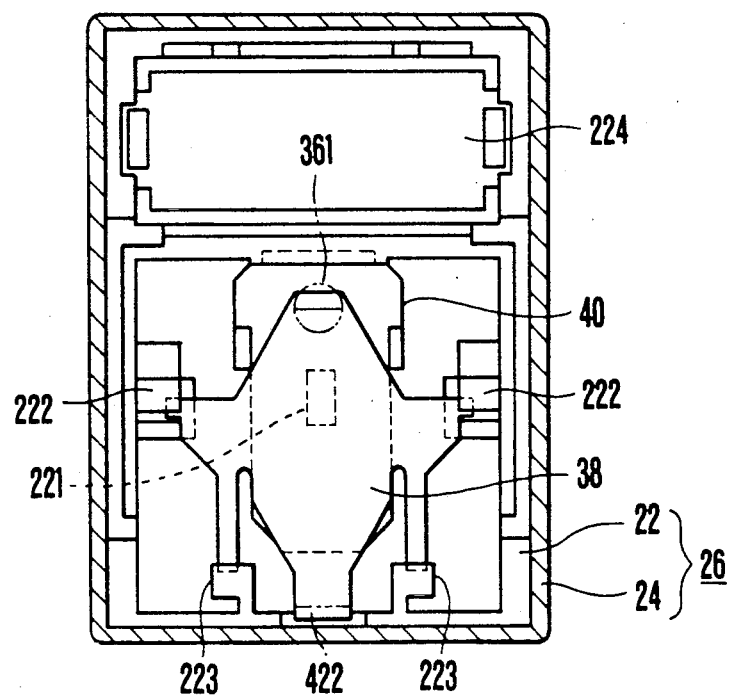
FIG. 33 is a view showing the inside of a bottom portion of the casing in the indicator built-in switch unit depicted in FIG. 31.

FIG. 31 is a longitudinal section showing an indicator built-in switch unit according to an eighth embodiment of the present invention; FIG. 32 is a front view of the indicator built-in switch unit depicted in FIG. 31; and FIG. 33 is a view showing the inside of a bottom portion of the casing in the indicator built-in switch unit depicted of FIG. 31. The disadvantage in the conventional technique shown in FIGS. 26 and 27 can be eliminated by this eighth embodiment.

In this eighth embodiment the indicator built-in switch unit 20 has a casing 26 which is composed of a box-like holder 22 made of an insulator and opened forward (left in FIG. 31) and a box-like cover 24 made of an insulator and fitted on the holder 22 from the opening side.

A flexible printed circuit board 30 having a conductor at one side and wound on both front and rear surfaces of a reinforcement plate 28 is arranged in the casing 26 along its front portion. The flexible printed circuit board 30 is bent in the casing 26 so that a part of the circuit board 30 is drawn out of the casing 26 at the rear surface thereof through a gap between the holder 22 and a back cover 224 of the holder 22 for external connection. The reference numeral 32 designates a connector.

A segmental indicator 34 is attached on the front side of the reinforcement plate 28 so that the front surface of the indicator 34 is arranged along the inclined front portion of an operation cover 42 which will be described later and, at the same time, terminals 341 of the indicator 34 are soldered to the flexible printed circuit board 30.

The segmental indicator which is, for example, made of a light-emitting diode indicator (LED display), is capable of indicating a number of four digits at its maximum as shown in FIG. 32.

A switch 36 such as a tact switch has an actuator 361 having terminals soldered to the flexible printed circuit board 30. A light-transmissible operation cover 42 is removably attached in the front portion of the casing 26. The light-transmissible operation cover 42 has two fitting portions 421 rotatably and removably fitted on two projection shafts 241 respectively projected inward from the left and right sides of the cover 24 so that the operation cover 42 is rotatable around the projection shafts 241 in the directions indicated by an arrow A.

The operation cover 42 may be transparent semitransparent or colored. To make it easy to see the contents of indication in the segmental indicator 34, semitransparent one is preferably used.

An inverted V-shaped movable member 38 having elasticity is put in the bottom portion of the casing 26 (more particularly, in the bottom portion of the holder 22). A supporting portion 221 provided on the bottom of holder 22 is used as a fulcrum of the movable member 38. Further, the longer-side end portion of the movable member 38 is used as a point of reception of force, so that the longer-side end portion can be pushed or released by a projecting portion 422 provided on the operation cover 42 in response to the pushing operation applied on the operation cover 42 in the directions of the arrow A. Furthermore, the shorter-side end portion of the movable member 38 is used as a point of application of force, by which the actuator 361 of the switch 36 can be pushed or released in the directions of the arrow B. Thus, an operation mechanism for the switch 36 is constituted. As shown in FIG. 33, the holder 22 has engagement/stopper portions 222 for preventing the floating-up of the movable member 38, and engagement/stopper portions 223 for preventing the projecting-out of the movable member 38. The reference numeral 40 designates a reinforcement plate spring for increasing the restoring force of the movable member 38 and the operation cover 42.

In this embodiment, an opening portion 423 is provided in a place which is in the front surface of the operation cover but out of the front of the segmental indicator 34. A dot-matrix indicator 44 is attached to the rear of the opening portion 423 by an indicator holder 46. Further, a light-transmissible window plate 48 is fitted in the opening portion 423. A flexible printed circuit board 50 is connected to the dot-matrix indicator 44 and bent in the casing 26 so that a part of the circuit board 50 is extended out of the casing 26 at the rear surface thereof through a gap between the back cover 224 and the cover 24 for external connection. The reference numeral 52 designates a connector. Accordingly, in this embodiment, the dot-matrix indicator 44 can be operated with the operation cover 42. Although this embodiment has good visual access to the contents of indication because the dot-matrix indicator 44 is always located forward compared with the case where the dot-matrix indicator 44 is fixed separately from the operation cover 42, it is possible for the dot-matrix indicator 44 to be fixed in the casing 26.

In this eighth embodiment, the dot-matrix indicator 44 is made of an electroluminescent indicator (EL display) which is, for example, formed by packing a display panel of 48×64 dots and a drive circuit in a casing. Assuming now that 16×16 dots are allocated to one character, then the indicator 44 can display 12 characters. Because a DC low voltage (for example, DC 30V or less) driven type EL indicators have been developed in recent years, it is preferable to use such type indicators. Although a liquid crystal indicator may be used as the dot-matrix indicator 44, the electroluminescent indicator is rather preferred for the following reasons (1) the EL indicator has a wide angle of field to make it easy to see obliquely; (2) the EL indicator is of a self-light-emission type making it easy to see in the dark; and the like. The window plate 48 may be preferably transparent or semitransparent near thereto to allow ease in seeing, because the dot-matrix indicator 44 is lower in intensity of light emission than the segmental indicator 34. In short, according to the indicator built-in switch unit 20, one item such as destination, tradename, etc., and the other item such as fare, etc., can be displayed together by means of displaying both the items on the dot-matrix and segmental indicators 34 and 44, respectively. Accordingly, the selection of the switch can be made easily compared with the conventional indicator built-in switch unit 2 which can display nothing but digits.

Further, both the dot-matrix indicator 44 and the segmental indicator 34 are electrically variable in the contents of indication, so that the contents of indication can be changed with little work involved by changing a program for controlling the indicators. Accordingly, the indicator built-in switch unit 20 can easily allow the change of the fare as well as the change of the destination or tradename, as with the conventional illuminated push-button switch 6 of the type designed to change the name indicator 8. Further, one switch (indicator built-in switch unit 20) can be used for multiple purposes through changing over the contents of indication in the two indicators 34 and 44. As an example, another destination and another fare switched by one switch can be displayed in a ticket vending machine. Consequently, the number of switches can be reduced.

There may be a thought that the dot-matrix indicator 44 is used for displaying both destination and fare with no provision of the segmental indicator 34. In this case, however, there are disadvantages as follows. In the dot-matrix indicator, a large number of dots are required for displaying complex characters (for example, Chinese letters) or displaying characters smoothly. Accordingly, the duty factor of a drive signal is reduced so that the indication is darkened. If the peak value of the drive signal is increased in order to lighten the indication, there arises a problem in voltage withstanding of elements and heating at the time of full lighting. Further, the drive circuit of the dot-matrix indicator is complicated making wiring difficult and require complex software for numerical indication. If segmental indication is therefore used in the digit portion, light indication can be made with no occurrence of the problem in heating and, at the same time, the drive circuit can be simplified to make wiring easy and eliminate the complexity in software. If both the segmental indicator 34 and the dot-matrix indicator 44 are provided in the switch, on the contrary, the switch can be used at the time of failure of one indicator as long as either of the destination (or tradename) and the fare can be indicated. For this reason, it is preferable that both the segmental indicator 34 and the dot-matrix indicator 44 are provided in the switch.

The reinforcement plate 28 may be replaced by a solid (hard) printed circuit board. In this case, the flexible printed circuit board 30 may be connected to the solid printed circuit board so that a part of the flexible printed circuit board 30 can be extended out of the casing 26. Or, the reinforcement plate 28 and the flexible printed circuit board 30 may be replaced by a solid printed circuit board. In this case, a part of the solid printed circuit board may be extended out of the casing 26. Similarly, when the dot-matrix indicator 44 is designed to be fixed in the casing 26, the flexible printed circuit board may be replaced by a solid printed circuit board. In this case, a part of the solid printed circuit board may be extended out of the casing 26. The operation cover 42 rotationally movable as described above may be replaced by an operation cover straight movable (slidable) in the front and rear directions of the switch casing.

What is claimed is:

1. A built-in indicator switch unit comprising:
   a casing made of an insulating material and having a substantially open front portion and a rear portion;
   a printed circuit board arranged in said casing, substantially in parallel to said front portion of said casing, said printed circuit including a part projecting outside said casing;
   an indicator attached to a front side of said printed circuit board in said casing and facing said open front portion;
   a switch attached to a rear side of said printed circuit board;
   a light-transmissible operation cover fitted in said front portion of said casing and movable in a direction of a pushing force exerted on said operation cover; and
   an operation mechanism for actuating said switch, said operation mechanism inverting said pushing force to a reversed force in response to a pushing operation applied on said operation cover, whereby said switch is actuated by said reversed force.

2. A built-in indicator switch unit according to claim 1, wherein said operation cover is fitted in the front portion of said casing and is slidably movable towards and away from the rear portion of said casing.

3. A built-in indicator switch unit according to claim 1, wherein said operation cover is fitted in the front portion of said casing and is rotatably movable towards and away from the rear portion of said casing.

4. A built-in indicator switch unit according to claim 1, wherein said printed circuit board is one selected from a solid printed circuit board and a flexible printed circuit board, wherein said projecting part of said printed circuit board is extended out at one side of said casing, and wherein a rear corner portion of said casing at another side of said casing opposite to said one side is cut away.

5. A built-in indicator switch unit according to claim 1, wherein said printed circuit board is a flexible printed circuit board, and wherein said projecting part of said printed circuit board is extended out from a rear side of said casing.

6. A built-in indicator switch unit according to claim 1, wherein a bent lever-like movable member is received in a bottom portion of said casing so that a fulcrum of said lever-like movable member is provided on said casing, and wherein said operation mechanism is so configured that when one end portion of said movable member is pressed by a leg extended from said operation cover, an actuator projecting at a rear side of said switch is pressed by the other end portion of said movable member.

7. A built-in indicator switch unit according to claim 6, wherein said operation mechanism includes a reinforcement plate spring for reinforcing a restoring force of said movable member, and wherein said casing is composed of a box-like holder open at its front side and a box-like cover fitted on said holder to cover said front side, said reinforcement plate spring being fitted in a bottom portion of said holder, said movable member being fitted on said plate spring.

8. A built-in indicator switch unit comprising:
   a casing made of an insulating material;
   a light-transmissible operation cover fitted in a front portion of said casing so as to be movable in response to a pushing force exerted on said operation cover;
   a printed circuit board arranged in said casing, substantially in parallel to a front portion of said operation cover or inclined slightly thereto;
   an indicator having a plurality of LED-chip segments directly attached to a front side of said printed circuit board, said LED-chip segments being selectively activatable for display;
   a switch attached to a rear side of said printed circuit board in said casing; and
   an operation mechanism for actuating said switch, said operation mechanism inverting said pushing force to a reversed pushing force in response to a pushing operation applied onto said operation cover, whereby said switch is actuated by said reversed force.

9. A built-in indicator switch unit comprising:
   a casing made of an insulating material;
   a light-transmissible operation cover fitted in a front portion of said casing so as to be movable in response to a pushing force exerted on said operation cover;
   a flexible printed circuit board arranged in said casing, substantially in parallel to a front portion of said operation cover or inclined slightly thereto;
   an indicator having a second printed circuit board provided with a plurality of LED-chip segments mounted thereon, said second printed circuit board being directly soldered to a front side of said flexible printed circuit board;
   a switch attached on a rear side of said flexible printed circuit board in said casing, and
   an operation mechanism for actuating said switch, said operation mechanism inverting said pushing force to a reversed pushing force in response to a pushing operation applied onto said operation cover, whereby said switch is actuated by said reversed force.

10. A built-in indicator switch unit comprising:
    a casing made of an insulating material;
    a light-transmissible operation cover fitted in a front portion of said casing so as to be movable in response to pushing force exerted on said operation cover;
    a dot-matrix indicator and a segmental indicator both received in said casing and behind said operation cover;
    a switch received in said casing; and
    an operation mechanism for actuating said switch, said operation mechanism inverting said pushing force to a reversed pushing force in response to a pushing operation applied on said operation cover, whereby said switch is actuated by said reverse force.

11. A built-in indicator switch unit according to claim 10, wherein said dot-matrix indicator is attached to a rear portion of said operation cover, and a flexible printed circuit board partly extended out of said casing at one end, is connected to said dot-matrix indicator at an opposite end so that said dot-matrix indicator is moved together with movement of said operation cover.

12. A built-in indicator switch unit according to claim 10, wherein said dot-matrix indicator is made of an electroluminescent indicator.

* * * * *